United States Patent
Fujiwara et al.

(10) Patent No.: US 10,752,755 B2
(45) Date of Patent: Aug. 25, 2020

(54) COMPOSITION FOR HEAT-DISSIPATING MEMBER, HEAT-DISSIPATING MEMBER, ELECTRONIC INSTRUMENT, AND METHOD FOR PRODUCING HEAT-DISSIPATING MEMBER

(71) Applicants: JNC CORPORATION, Tokyo (JP); OSAKA RESEARCH INSTITUTE OF INDUSTRIAL SCIENCE AND TECHNOLOGY, Osaka (JP)

(72) Inventors: Takeshi Fujiwara, Chiba (JP); Takayuki Hattori, Chiba (JP); Jyunichi Inagaki, Chiba (JP); Takafumi Kuninobu, Chiba (JP); Kazuhiro Takizawa, Chiba (JP); Yasuyuki Agari, Osaka (JP); Hiroshi Hirano, Osaka (JP); Joji Kadota, Osaka (JP); Akinori Okada, Osaka (JP)

(73) Assignees: JNC CORPORATION, Tokyo (JP); OSAKA RESEARCH INSTITUTE OF INDUSTRIAL SCIENCE AND TECHNOLOGY, Osaka-fu (JP)

( * ) Notice: Subject to any disclaimer, the term of this patent is extended or adjusted under 35 U.S.C. 154(b) by 34 days.

(21) Appl. No.: 16/081,430

(22) PCT Filed: Feb. 28, 2017

(86) PCT No.: PCT/JP2017/008029
§ 371 (c)(1),
(2) Date: Aug. 31, 2018

(87) PCT Pub. No.: WO2017/150589
PCT Pub. Date: Sep. 8, 2017

(65) Prior Publication Data
US 2019/0023847 A1   Jan. 24, 2019

(30) Foreign Application Priority Data

Mar. 2, 2016  (JP) .................................. 2016-040525

(51) Int. Cl.
*C08K 9/06* (2006.01)
*C08L 63/00* (2006.01)
*C08L 83/04* (2006.01)
*C08G 59/32* (2006.01)
*C09K 5/14* (2006.01)
*C08L 83/06* (2006.01)
*C08K 9/04* (2006.01)
*H01L 23/26* (2006.01)
*C09C 3/12* (2006.01)
*C08K 3/04* (2006.01)
(Continued)

(52) U.S. Cl.
CPC ................ *C08K 9/06* (2013.01); *C08G 59/32* (2013.01); *C08G 59/3281* (2013.01); *C08G 77/045* (2013.01); *C08K 3/041* (2017.05); *C08K 3/046* (2017.05); *C08K 3/14* (2013.01); *C08K 3/22* (2013.01); *C08K 3/28* (2013.01); *C08K 3/346* (2013.01); *C08K 3/38* (2013.01); *C08K 9/04* (2013.01); *C08L 63/00* (2013.01); *C08L 83/04* (2013.01); *C08L 83/06* (2013.01); *C09C 3/12* (2013.01); *C09K 5/14* (2013.01); *H01L 23/26* (2013.01); *H01L 23/3737* (2013.01); *C08K 2003/2227* (2013.01); *C08K 2003/282* (2013.01); *C08K 2003/385* (2013.01); *C08K 2201/001* (2013.01)

(58) Field of Classification Search
CPC ..................................... C09C 3/12; C08K 9/06
See application file for complete search history.

(56) References Cited

U.S. PATENT DOCUMENTS 7,319,129 B2* 1/2008 Yoshida .................... C07F 7/21
528/34
7,423,107 B2* 9/2008 Ootake .................. C08G 77/38
525/478
(Continued)

FOREIGN PATENT DOCUMENTS

JP  2006265527  10/2006
JP  2009013294  1/2009
(Continued)

OTHER PUBLICATIONS

"Search Report of Europe Counterpart Application", dated Sep. 19, 2019, p. 1-p. 7.
(Continued)

*Primary Examiner* — Marc S Zimmer
(74) *Attorney, Agent, or Firm* — JCIPRNET

(57) ABSTRACT

This invention is a composition capable of forming a heat-dissipating member that has high heat resistance and high thermal conductivity. This composition for a heat-dissipating member comprises a thermally conductive first inorganic filler bonded to one end of a first coupling agent, and a thermally conductive second inorganic filler bonded to one end of a second coupling agent, the composition being characterized in that: the other end of the first coupling agent and the other end of the second coupling agent are each bonded to a bifunctional or higher silsesquioxane by a curing treatment, as illustrated in FIG. 2; or at least one of the first coupling agent and the second coupling agent includes, in the structure thereof, a silsesquioxane, and the other end of the first coupling agent and the other end of the second coupling agent are bonded together as illustrated in FIG. 3.

19 Claims, 5 Drawing Sheets

(51) Int. Cl.
*C08G 77/04* (2006.01)
*C08K 3/14* (2006.01)
*C08K 3/22* (2006.01)
*C08K 3/28* (2006.01)
*C08K 3/34* (2006.01)
*C08K 3/38* (2006.01)
*H01L 23/373* (2006.01)

(56) References Cited

U.S. PATENT DOCUMENTS

| | | | |
|---|---|---|---|
| 9,453,105 B2* | 9/2016 | Suwa | H01L 23/296 |
| 2007/0292623 A1* | 12/2007 | Lin | C09D 1/00 |
| | | | 427/407.1 |
| 2010/0160577 A1* | 6/2010 | Hirano | C08L 83/04 |
| | | | 525/477 |
| 2011/0171318 A1* | 7/2011 | Friesen | A61P 13/12 |
| | | | 424/601 |
| 2012/0172485 A1 | 7/2012 | Sun et al. | |
| 2012/0205315 A1* | 8/2012 | Liu | B01J 20/286 |
| | | | 210/656 |
| 2015/0030832 A1* | 1/2015 | Katsura | C09D 183/04 |
| | | | 428/215 |
| 2017/0073505 A1* | 3/2017 | Mohan | C09C 1/44 |
| 2017/0088696 A1* | 3/2017 | Dolog | C09K 8/512 |

FOREIGN PATENT DOCUMENTS

| | | |
|---|---|---|
| JP | 4379120 | 12/2009 |
| JP | 2010116543 | 5/2010 |
| JP | 4483344 | 6/2010 |
| JP | 2012097207 | 5/2012 |
| JP | 5013127 | 8/2012 |
| JP | 2012153846 | 8/2012 |
| JP | 5084148 | 11/2012 |
| JP | 5408597 | 2/2014 |
| WO | 2015170744 | 11/2015 |
| WO | 2016031888 | 3/2016 |

OTHER PUBLICATIONS

"International Search Report (Form PCT/ISA/210)", dated Apr. 4, 2017, with English translation thereof, pp. 1-4.

* cited by examiner

Comparative Example 1 (high temperature side)

COMPOSITION FOR HEAT-DISSIPATING MEMBER, HEAT-DISSIPATING MEMBER, ELECTRONIC INSTRUMENT, AND METHOD FOR PRODUCING HEAT-DISSIPATING MEMBER

CROSS-REFERENCE TO RELATED APPLICATION

This application is a 371 of international application of PCT application serial no. PCT/JP2017/008029, filed on Feb. 28, 2017, which claims the priority benefit of Japan application no. 2016-040525, filed on Mar. 2, 2016. The entirety of each of the abovementioned patent applications is hereby incorporated by reference herein and made a part of this specification.

TECHNICAL FIELD

The present invention relates to a composition that can form a heat-dissipating member used for an electronic instrument such as an electronic substrate, and particularly, to a heat-dissipating member which has both processability of a resin and very high heat resistance, and can additionally efficiently conduct and transfer heat generated in an electronic instrument and thus can dissipate heat.

BACKGROUND ART

In recent years, in semiconductor devices for power control of electric trains, hybrid vehicles, and electric vehicles, operation temperatures thereof have risen due to use of wide gap semiconductors. In silicon carbide (SiC) semiconductors and the like which have been particularly focused upon, since the operation temperature is 200° C. or higher, a packaging material therefor needs to have high heat resistance of 250° C. or higher. In addition, due to the rise in the operation temperature, thermal distortion may occur due to a difference between thermal expansion coefficients of materials used in a package, and there is also a problem of a reduced lifespan due to peeling off of a wiring or the like.

As a method of solving such a heat resistance problem, highly thermally conductive ceramic substrates such as aluminum nitride and silicon nitride and highly heat resistant organic resins and silicone resins combined with inorganic fillers for improving thermal conductivity have been developed and particularly the development of high heat resistance resins such as oxazine resins and high heat resistance silicone resins have progressed. In Patent Literature 1, a polybenzoxazine-modified bismaleimide resin having excellent heat resistance is disclosed. However, compounds that exhibit sufficient heat resistance and durability have not yet been utilized, and thus the development of materials with higher heat resistance has been performed.

As another method of solving a heat resistance problem of a member, there is a method in which thermal conductivity is improved, unevenness in temperature is reduced, and as a result, localized high temperatures are reduced. In addition, it can also be expected that there will be an effect in which, when the thermal conductivity is high, a temperature of a part in contact with something will be unlikely to rise. Generally, the introduction of many cyclic structures into a main chain of molecules in order to increase thermal conductivity of a resin component has been examined. In addition, it is known that high linearity of molecular chains is preferred in order to improve thermal conductivity of such resins. Examples of a compound having many cyclic structures and linearity include a liquid crystal compound.

In Patent Literature 2, as a method of improving the thermal conductivity of a resin, a method in which a liquid crystal composition containing a liquid crystal compound having a polymerization group at both ends is alignment-controlled using an alignment control additive, a rubbing treatment method, or the like, polymerization is performed in a state in which the alignment state is maintained, and thus a resin film having high thermal conductivity is obtained is disclosed.

CITATION LIST

Patent Literature

[Patent Literature 1]
  Japanese Unexamined Patent Application Publication No. 2012-97207
[Patent Literature 2]
  Japanese Unexamined Patent Application Publication No. 2006-265527

SUMMARY OF INVENTION

Technical Problem

As described above, for a substrate of a semiconductor device used at high temperatures, a material having high heat resistance and thermal conductivity is desirable.

Accordingly, an objective of the present invention is to provide a composition that can form a heat-dissipating member having high heat resistance and high thermal conductivity.

Solution to Problem

The inventors found that, in combining an organic material and an inorganic material, when inorganic materials are connected to each other rather than adding an inorganic material to a resin, that is, when inorganic materials are directly bonded to each other using a coupling agent and a bifunctional or higher silsesquioxane (refer to FIG. 2), or when inorganic materials are directly bonded to each other using a coupling agent synthesized from a silsesquioxane (refer to FIG. 3), it is possible to form a heat-dissipating member that has very high heat resistance (a glass transition temperature and a decomposition temperature) of about 350° C. or higher and has thermal conductivity, and thereby completed the present invention.

A composition for a heat-dissipating member of a first aspect of the present invention is a composition for a heat-dissipating member that includes a thermally conductive first inorganic filler that is bonded to one end of a first coupling agent; and a thermally conductive second inorganic filler that is bonded to one end of a second coupling agent.

For example, as shown in FIG. 2, through curing treatment, the other end of a first coupling agent 11 and the other end of a second coupling agent 12 are bonded to a bifunctional or higher silsesquioxane 21, or at least one of a first coupling agent and a second coupling agent contains a silsesquioxane in its structure, for example, as shown in FIG. 3, in which the other end of a first coupling agent 13 and the other end of the second coupling agent 12 are bonded to each other. "One end" and "the other end" may be tips or ends in a shape of a molecule and may or may not be both ends of the long side of a molecule.

In such a configuration, a heat-dissipating member can be formed by directly bonding inorganic fillers using a coupling agent and a silsesquioxane. Therefore, it is possible to directly propagate phonons which are a main element for thermal conduction, and a cured heat-dissipating member can have very high thermal conductivity and very high heat resistance.

According to a composition for a heat-dissipating member of a second aspect of the present invention, in the composition for a heat-dissipating member according to the first aspect of the present invention, the first inorganic filler and the second inorganic filler are a nitride, a metal oxide, a silicate compound, or a carbon material.

In such a configuration, the heat-dissipating member includes a more preferable compound for the inorganic fillers.

According to a composition for a heat-dissipating member of a third aspect of the present invention, in the composition for a heat-dissipating member according to the first aspect or the second aspect of the present invention, the first inorganic filler and the second inorganic filler are at least one selected from the group consisting of boron nitride, aluminum nitride, boron carbide, boron carbonitride, graphite, carbon fibers, carbon nanotubes, alumina, and cordierite.

In such a configuration, it is possible to obtain a heat-dissipating member in which the thermal conductivity of the inorganic filler is high and a thermal expansion coefficient is very small or negative.

A composition for a heat-dissipating member of a fourth aspect of the present invention further includes a third inorganic filler having a different thermal expansion coefficient from those of the first inorganic filler and the second inorganic filler, in the composition for a heat-dissipating member according to any one of the first aspect to the third aspect of the present invention.

In such a configuration, when the first inorganic filler and the second inorganic filler have a two-dimensional plate shape or a one-dimensional linear shape, if only the first inorganic filler and the second inorganic filler are combined with each other, the physical properties of the combined heat-dissipating member composition include high anisotropy. Adding the third inorganic filler has an advantage that the orientation of the first and second inorganic fillers is relaxed and the anisotropy is reduced. In addition, when the thermal expansion coefficient of the first and second inorganic fillers is very small or negative, if the third inorganic filler having a positive thermal expansion coefficient is added, it is possible to perform accurate control according to the fraction incorporated such that a negative value for the thermal expansion coefficient becomes a positive value. Although there are no limitations on inorganic fillers which can be used for the third inorganic filler, an inorganic filler having a high thermal conductivity is desirable.

A composition for a heat-dissipating member of a fifth aspect of the present invention further includes an organic compound or a polymer compound that is not bonded to the first inorganic filler and the second inorganic filler, in the composition for a heat-dissipating member according to any one of the first aspect to the fourth aspect of the present invention.

In such a configuration, in the heat-dissipating member obtained by directly connecting the first and second inorganic fillers and performing curing, when the particle size of the filler is increased in order to improve thermal conductivity, the porosity increases accordingly. When voids are filled with a compound that is not bonded, it is possible to improve thermal conductivity and water vapor barrier properties.

According to a composition for a heat-dissipating member of a sixth aspect of the present invention, in the composition for a heat-dissipating member according to any one of the first aspect to the fifth aspect of the present invention, the bifunctional or higher silsesquioxane is a silsesquioxane including oxiranyl, oxiranylene, succinic anhydride, phthalic anhydride, or 3,4-epoxycyclohexyl.

In such a configuration, the silsesquioxane is thermosetting, and can be cured without being affected by an amount of the filler, and also has excellent heat resistance. In addition, since the molecular structure has symmetry and linearity, these properties are advantageous for conduction of phonons. In consideration of heat resistance, the framework of the silsesquioxane preferably has a two-dimensional structure or a three-dimensional structure, and more preferably is of a ladder type, a cage type, or a double decker type.

According to a composition for a heat-dissipating member of a seventh aspect of the present invention, in the composition for a heat-dissipating member according to the sixth aspect of the present invention, the bifunctional or higher silsesquioxane is a compound selected from among groups of compounds represented by Formula (1) and Formula (2),

[Chem. 1]

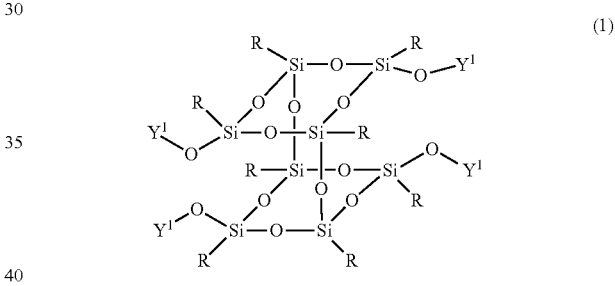

(1)

[herein, R independently represent an alkyl group having 1 to 45 carbon atoms, a cycloalkyl group having 4 to 8 carbon atoms, an aryl group or an arylalkyl group; in the alkyl group having 1 to 45 carbon atoms, any hydrogen atom is optionally substituted with a fluorine atom and any —$CH_2$— is optionally substituted with —O— or —CH=CH—; in a benzene ring in the aryl group and the arylalkyl group, any hydrogen atom is optionally substituted with a halogen atom or an alkyl group having 1 to 10 carbon atoms; in the alkyl group having 1 to 10 carbon atoms, any hydrogen atom is optionally substituted with a fluorine atom and any —$CH_2$— is optionally substituted with —O— or —CH=CH—; in the alkylene group in the arylalkyl group, the number of carbon atoms is 1 to 10, and any —$CH_2$— is optionally substituted with —O—; and $Y^1$ independently represent a group represented by Formula (a).]

[Chem. 2]

(a)

[herein, X independently represent a cyclopentyl group, a cyclohexyl group, an alkyl group having 1 to 10 carbon atoms in which any hydrogen atom is optionally substituted with a fluorine atom and one —CH$_2$— is optionally substituted with —O—, a phenyl group in which any hydrogen atom is optionally substituted with a halogen atom or an alkyl group having 1 to 10 carbon atoms, a phenylalkyl group including a phenyl group in which any hydrogen atom is optionally substituted with a halogen atom or an alkyl group having 1 to 10 carbon atoms and an alkylene group having 1 to 4 carbon atoms, or a group including oxiranyl, oxiranylene, succinic anhydride, phthalic anhydride, or 3,4-epoxycyclohexyl; in the alkyl group having 1 to 10 carbon atoms which is a substituent of the phenyl group, any hydrogen atom is optionally substituted with a fluorine atom and any —CH$_2$— is optionally substituted with —O—; in the alkylene group in the phenylalkyl group, one —CH$_2$— is optionally substituted with —O—; and at least one X is a group including oxiranyl, oxiranylene, succinic anhydride, phthalic anhydride, or 3,4-epoxycyclohexyl.]

[Chem. 3]

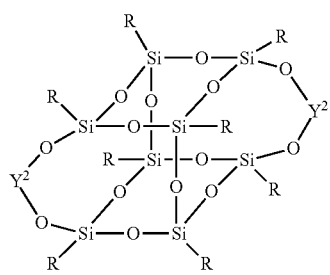

(2)

[herein, R has the same meaning as R in Formula (1), and Y$^2$ is a group represented by Formula (b) or a group represented by Formula (c).]

[Chem. 4]

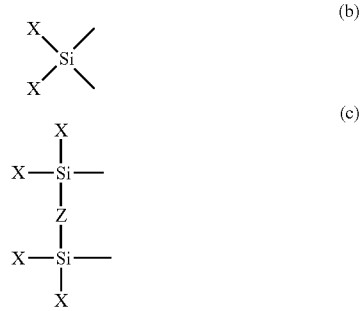

[herein, in Formula (b) and Formula (c), X has the same meaning as X in Formula (a) and Z in Formula (c) is —O—, —CH$_2$— or a single bond.]

In such a configuration, since the inorganic fillers are directly bonded to each other using a coupling agent and a silsesquioxane having high heat resistance, it is possible to form a composite member in which a glass transition as in a polymer is not exhibited, thermal decomposition is unlikely to occur, and heat can be directly transferred by phonon oscillation through the coupling agent and the silsesquioxane.

According to a composition for a heat-dissipating member of an eighth aspect of the present invention, in the composition for a heat-dissipating member according to the sixth aspect or the seventh aspect of the present invention, in Formula (1) and Formula (2), R independently represent a cyclohexyl group, a phenyl group in which any hydrogen atom is optionally substituted with a halogen atom or an alkyl group having 1 to 4 carbon atoms, or a phenylalkyl group including a phenyl group in which any hydrogen atom is optionally substituted with a halogen atom or an alkyl group having 1 to 4 carbon atoms and an alkylene group having 1 to 4 carbon atoms;

in the alkyl group having 1 to 4 carbon atoms which is a substituent of the phenyl group, any hydrogen atom is optionally substituted with a fluorine atom and one —CH$_2$— is optionally substituted with —O—;

X independently represent an alkyl group having 1 to 4 carbon atoms, a fluorinated alkyl group having 1 to 4 carbon atoms, a cyclopentyl group, a cyclohexyl group, a phenyl group in which any hydrogen atom is optionally substituted with a halogen atom or an alkyl group having 1 to 4 carbon atoms, a phenylalkyl group including a phenyl group in which any hydrogen atom is optionally substituted with a halogen atom or an alkyl group having 1 to 4 carbon atoms and an alkylene group having 1 to 4 carbon atoms, or a group including oxiranyl, oxiranylene, succinic anhydride, phthalic anhydride, or 3,4-epoxycyclohexyl; and in Formula (a), Formula (b) and Formula (c), at least one X is a group including oxiranyl, oxiranylene, succinic anhydride, phthalic anhydride, or 3,4-epoxycyclohexyl.

In such a configuration, the composition for a heat-dissipating member includes a more preferable compound as a silsesquioxane. These compounds are thought to have higher molecular linearity and more advantageous phonon conduction.

According to a composition for a heat-dissipating member of a ninth aspect of the present invention, in the composition for a heat-dissipating member according to any one of the sixth aspect to the eighth aspect of the present invention, in Formula (1) and Formula (2), R is a cyclohexyl group, a phenyl group in which any hydrogen atom is optionally substituted with a halogen atom or an alkyl group having 1 to 4 carbon atoms, or a phenylalkyl group including a phenyl group in which any hydrogen atom is optionally substituted with a halogen atom or an alkyl group having 1 to 4 carbon atoms and an alkylene group having 1 to 4 carbon atoms;

in the alkyl group having 1 to 4 carbon atoms which is a substituent of the phenyl group, any hydrogen atom is optionally substituted with a fluorine atom and one —CH$_2$— is optionally substituted with —O—;

in Formula (a), Formula (b) and Formula (c), one of X is a group including oxiranyl, oxiranylene, succinic anhydride, phthalic anhydride, or 3,4-epoxycyclohexyl, and the remaining X is an alkyl group having 1 to 4 carbon atoms, a fluorinated alkyl group having 1 to 4 carbon atoms, a cyclopentyl group, a cyclohexyl group, a phenyl group in which any hydrogen atom is optionally substituted with a halogen atom or an alkyl group having 1 to 4 carbon atoms, or a phenylalkyl group including a phenyl group in which any hydrogen atom is optionally substituted with a halogen atom or an alkyl group having 1 to 4 carbon atoms and an alkylene group having 1 to 4 carbon atoms;

in the alkyl group having 1 to 4 carbon atoms which is a substituent of the phenyl group, any hydrogen atom is optionally substituted with a fluorine atom and any —CH$_2$— is optionally substituted with —O—.

In such a configuration, the composition for a heat-dissipating member includes a more preferable compound as a silsesquioxane. These compounds are thought to have higher molecular linearity and more advantageous phonon conduction.

According to a composition for a heat-dissipating member of a tenth aspect of the present invention, in the composition for a heat-dissipating member according to any one of the sixth aspect to the ninth aspect of the present invention, in Formula (1) and Formula (2), R is a cyclohexyl or phenyl group;

in Formula (a), Formula (b) and Formula (c), one of X is a group including oxiranyl, oxiranylene, succinic anhydride, phthalic anhydride, or 3,4-epoxycyclohexyl, and the remaining X is a methyl, ethyl, t-butyl, cyclopentyl, cyclohexyl or phenyl group.

In such a configuration, the composition for a heat-dissipating member includes a more preferable compound as a silsesquioxane. These compounds are thought to have higher molecular linearity and more advantageous phonon conduction.

According to a composition for a heat-dissipating member of an eleventh aspect of the present invention, in the composition for a heat-dissipating member according to any one of the sixth aspect to the tenth aspect of the present invention, in Formula (1) and Formula (2), R is a phenyl group;

in Formula (a), Formula (b) and Formula (c), one of X is a group including oxiranyl, oxiranylene, succinic anhydride, phthalic anhydride, or 3,4-epoxycyclohexyl, and the remaining X is a methyl or phenyl group.

In such a configuration, the composition for a heat-dissipating member includes a more preferable compound as a silsesquioxane. These compounds are thought to have higher molecular linearity and more advantageous phonon conduction.

According to a composition for a heat-dissipating member of a twelfth aspect of the present invention, in the composition for a heat-dissipating member according to any one of the sixth aspect to the eleventh aspect of the present invention, the bifunctional or higher silsesquioxane is a compound represented by Formula (1-1). In Formula (1-1), Me represents a methyl group, and Ph represents a phenyl group.

[Chem. 5]

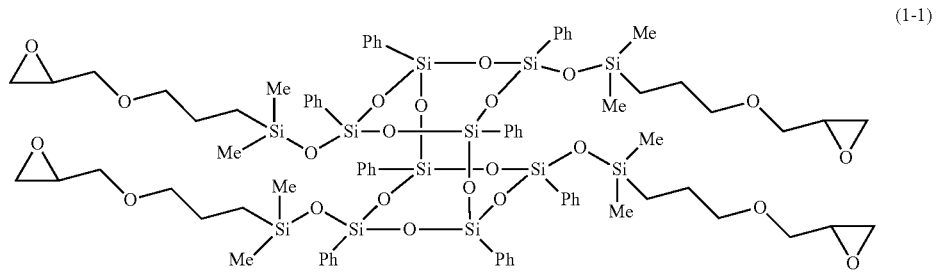

(1-1)

In such a configuration, the composition for a heat-dissipating member includes a particularly preferable compound as a silsesquioxane. In addition, these compounds are preferable because they have excellent physical properties, ease of production, and ease of handling.

According to a composition for a heat-dissipating member of a thirteenth aspect of the present invention, in the composition for a heat-dissipating member according to any one of the sixth aspect to the eleventh aspect of the present invention, the bifunctional or higher silsesquioxane is a compound represented by Formula (1-2). In Formula (1-2), Me represents a methyl group, and Ph represents a phenyl group.

[Chem. 6]

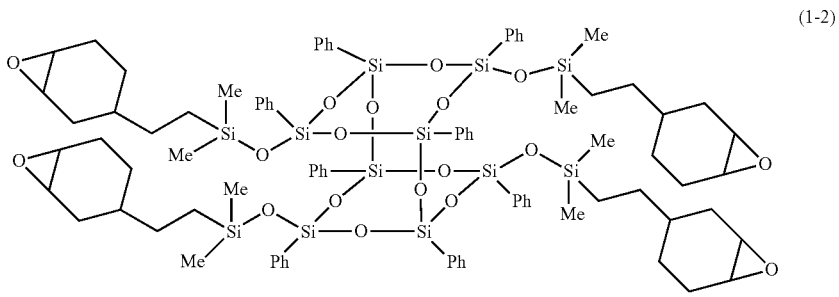

(1-2)

In such a configuration, the composition for a heat-dissipating member includes a particularly preferable compound as a silsesquioxane. In addition, these compounds are preferable because they have excellent physical properties, ease of production, and ease of handling.

According to a composition for a heat-dissipating member of a fourteenth aspect of the present invention, in the composition for a heat-dissipating member according to any one of the sixth aspect to the eleventh aspect of the present invention, the bifunctional or higher silsesquioxane is a compound represented by Formula (2-1). In Formula (2-1), Me represents a methyl group, and Ph represents a phenyl group.

[Chem. 7]

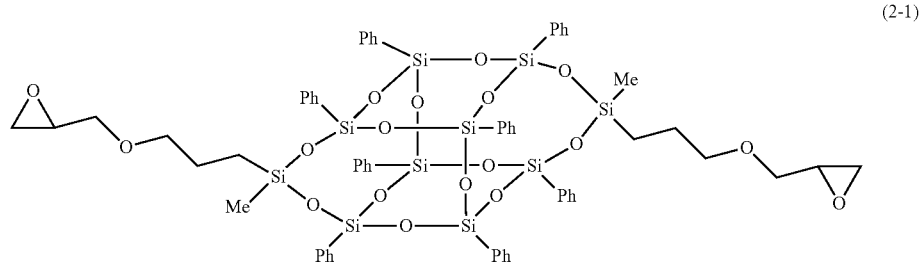

(2-1)

In such a configuration, the composition for a heat-dissipating member includes a particularly preferable compound as a silsesquioxane. In addition, these compounds are preferable because they have excellent physical properties, ease of production, and ease of handling.

According to a composition for a heat-dissipating member of a fifteenth aspect of the present invention, in the composition for a heat-dissipating member according to any one of the sixth aspect to the eleventh aspect of the present invention, the bifunctional or higher silsesquioxane is a compound represented by Formula (2-2). In Formula (2-2), Me represents a methyl group, and Ph represents a phenyl group.

[Chem. 8]

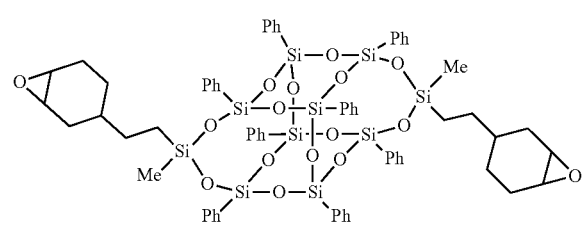

(2-2)

In such a configuration, the composition for a heat-dissipating member includes a particularly preferable compound as a silsesquioxane. In addition, these compounds are preferable because they have excellent physical properties, ease of production, and ease of handling.

According to a composition for a heat-dissipating member of a sixteenth aspect of the present invention, in the composition for a heat-dissipating member according to any one of the sixth aspect to the eleventh aspect of the present invention, the bifunctional or higher silsesquioxane is a compound represented by Formula (3-1). In Formula (3-1), Me represents a methyl group, and Ph represents a phenyl group.

[Chem. 9]

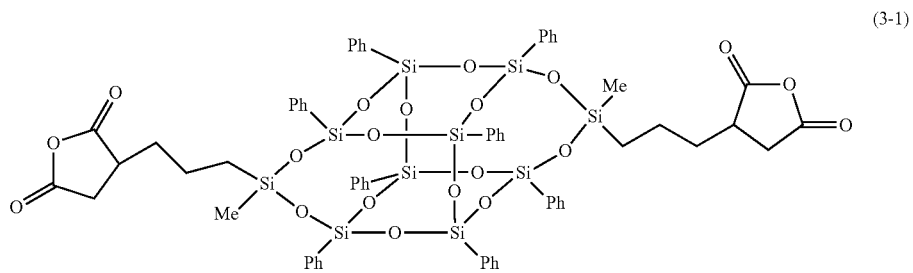

(3-1)

such a configuration, the composition for a heat-dissipating member includes a particularly preferable compound as a silsesquioxane. In addition, these compounds are preferable because they have excellent physical properties, ease of production, and ease of handling.

A heat-dissipating member of a seventeenth aspect of the present invention is a heat-dissipating member obtained by curing the composition for a heat-dissipating member according to any one of the first aspect to the sixteenth aspect of the present invention.

In such a configuration, the heat-dissipating member has a bond between the inorganic fillers, and since this bond does not cause molecular vibration or phase change like in a general resin, the heat-dissipating member can have high linearity of thermal expansion and higher thermal conductivity.

An electronic instrument of an eighteenth aspect of the present invention is an electronic instrument including the heat-dissipating member of the seventeenth aspect of the present invention; and an electronic device including a heating unit; wherein the heat-dissipating member is disposed on the electronic device such that it comes in contact with the heating unit.

In such a configuration, since the heat-dissipating member has favorable heat resistance and a thermal expansion coefficient that can be controlled at high temperatures, it is possible to reduce thermal distortion that may occur in an electronic instrument.

A method for producing a composition for a heat-dissipating member according to a nineteenth aspect of the present invention includes a process of bonding a thermally conductive first inorganic filler to one end of a first coupling agent; and a process of bonding a thermally conductive second inorganic filler to one end of a second coupling agent, the method further including a process of bonding the other end of the first coupling agent and the other end of the second coupling agent to a bifunctional or higher silsesquioxane; or a process of incorporating a silsesquioxane in a structure of at least one of the first coupling agent and the second coupling agent and bonding the other end of the first coupling agent and the other end of the second coupling agent.

In such a configuration, inorganic fillers are bonded to each other using a coupling agent and a silsesquioxane in a heat-dissipating member.

Advantageous Effects of Invention

The heat-dissipating member formed of the composition for a heat-dissipating member of the present invention has very high thermal conductivity and heat resistance. In addition, the heat-dissipating member has excellent properties such as controllability of a thermal expansion coefficient, chemical stability, hardness, and mechanical strength. The heat-dissipating member is suitable for, for example, a heat dissipation board, a heat dissipation plate (planar heatsink), a heat dissipation sheet, a heat dissipation coating, and a heat dissipation adhesive.

DESCRIPTION OF EMBODIMENTS

Figure 1:
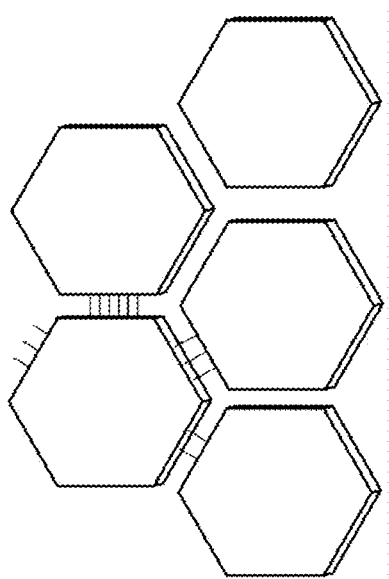
FIG. 1 is a conceptual diagram showing bonding of inorganic fillers using boron nitride as an example in a heat-dissipating member of the present invention.

Priority is claimed on Japanese Patent Application No. 2016-040525, filed Mar. 2, 2016, the content of which is incorporated herein by reference. The present invention will be more completely understood from the following detailed description. Further scope for application of the present invention will be clearly understood from the following detailed description. It should be understood, however, that the detailed description and the specific examples are preferred embodiments of the present invention and are set forth for the purpose of illustration only. From the detailed description, various modifications and alternations within the spirit and scope of the present invention will be clearly understood by those skilled in the art. The applicants do not intend to present any of described embodiments to the public and among alternations and alternative proposals, those that are not explicitly included in the scope of claims are parts of the invention under the doctrine of equivalents.

Embodiments of the present invention will be described below with reference to the drawings. Here, in the drawings, the same or corresponding parts will be denoted with the same or similar reference numerals, and redundant descriptions will be omitted. In addition, the present invention is not limited to the following embodiments.

Terms used in the present invention will be described. A compound represented by Formula (1) may be referred to as Compound (1). Compounds represented by other formulae may be similarly referred to in a simplified form. The expression "any A is optionally substituted with B or C" refers to a case in which at least one A is substituted with B and a case in which at least one A is substituted with C, and also a case in which at least one A is substituted with B and at the same time, at least one other A is substituted with C. In the chemical formulae shown in this specification, Me represents a methyl group and Ph represents a phenyl group. In the examples, display data of an electronic balance is represented using g (gram) which is a mass unit. Weight % and a weight ratio are data based on such numerical values.

[Composition for a Heat-Dissipating Member]

The composition for a heat-dissipating member of the present invention is a composition that can form a heat-dissipating member by directly bonding inorganic fillers using a coupling agent and a bifunctional or higher silsesquioxane according to curing. FIG. 1 shows an example in which boron nitride as an inorganic filler is used. When boron nitride (h-BN) is treated with a coupling agent, since boron nitride has no reactive group on the plane of particles, a coupling agent is bonded only to surrounding materials. Boron nitride treated with a coupling agent can form a bond with a bifunctional or higher silsesquioxane. Therefore, when the other end of the coupling agent bonded to boron nitride and the other end of a silsesquioxane that is additionally bonded to a coupling agent bonded to boron nitride are bonded to each other (refer to FIG. 2), boron nitride molecules are bonded to each other as shown in FIG. 1.

In this manner, when inorganic fillers are bonded to each other using a coupling agent and a silsesquioxane, since phonons can be directly propagated, the cured heat-dissipating member has very high thermal conductivity, and it is possible to produce a composite material in which a thermal expansion coefficient of an inorganic component is directly reflected.

Figure 2:
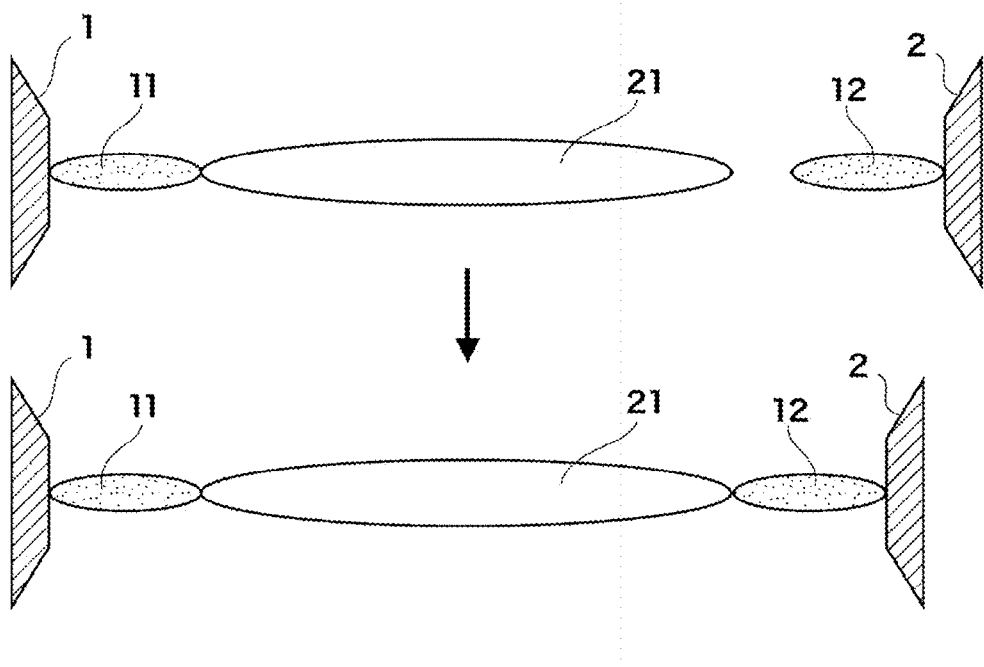
FIG. 2 is a conceptual diagram showing a state in which, through curing treatment of a composition for a heat-dissipating member, the other end of a silsesquioxane 21 bonded to a first coupling agent 11 is bonded to the other end of a second coupling agent 12.

For example, as shown in FIG. 2, a composition for a heat-dissipating member according to a first embodiment of the present invention includes a thermally conductive first inorganic filler 1 bonded to one end of a first coupling agent 11; and a thermally conductive second inorganic filler 2 bonded to one end of a coupling agent 12. In addition, one end of a silsesquioxane 21 is bonded to the other end of the first coupling agent 11. However, the other end of the silsesquioxane 21 is not bonded to the other end of the second coupling agent 12.

As shown in FIG. 2, when the composition for a heat-dissipating member is cured, the other end of the second coupling agent 12 is bonded to the other end of the silsesquioxane 21. In this manner, a bond between the inorganic fillers is formed. Here, realization of such a bond between the inorganic fillers is important in the present invention, and before the silane coupling agent is bonded to the inorganic filler, a silane coupling agent and a bifunctional or higher silsesquioxane may be reacted with each other using an organic synthetic technique in advance.

<Bifunctional or Higher Silsesquioxane>

The bifunctional or higher silsesquioxane is at least one of cage structure silsesquioxanes including oxiranyl, oxiranylene, succinic anhydride, phthalic anhydride, or 3,4-epoxycyclohexyl. The cage structure is a structure in which a plurality of cyclic siloxanes form a closed space and the shape of the closed space is not particularly limited. In addition, the present invention includes a silsesquioxane (for example, a double decker type) having a structure in which at least one or more parts of a cage structure are not blocked and a ladder type.

Specific examples of silsesquioxanes having such a structure can be represented by Compound (1) and Compound (2).

[Chem. 10]

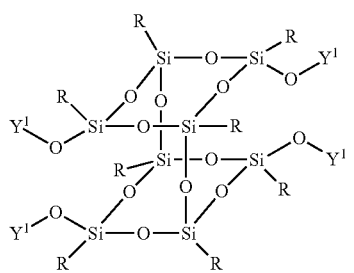

(1)

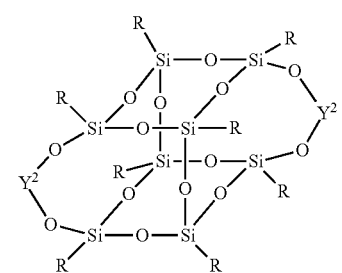

(2)

In Formula (1) and Formula (2), R is a group that is independently selected from an alkyl group having 1 to 45 carbon atoms, a cycloalkyl group having 4 to 8 carbon atoms, and aryl and arylalkyl groups. That is, in Formula (1) and Formula (2), eight R may be composed of two or more different groups, but they are all preferably the same group. In the alkyl group having 1 to 45 carbon atoms, any hydrogen atom is optionally substituted with a fluorine atom, any —CH$_2$— is optionally substituted with —O— or —CH═CH—, and two adjacent —CH$_2$— are not substituted with —O—. The alkyl group preferably has 1 to 10 carbon atoms.

When R is a cycloalkyl group having 4 to 8 carbon atoms, the group may have a crosslinked structure. Preferable examples of the cycloalkyl group include cyclopentyl and cyclohexyl groups, and a cyclohexyl group is more preferable.

When R is an aryl or arylalkyl group, in a benzene ring in these groups, any hydrogen atom is optionally substituted with a halogen or an alkyl group having 1 to 10 carbon atoms. Examples of the halogen include fluorine, chlorine and bromine. In the alkyl group having 1 to 10 carbon atoms, any hydrogen atom is optionally substituted with a fluorine atom, any —CH$_2$— is optionally substituted with —O— or —CH═CH—, and two adjacent —CH$_2$— are not substituted with —O—. The alkyl group preferably has 1 to 4 carbon atoms. In the alkylene group in the arylalkyl group, the number of carbon atoms is 1 to 10, and any —CH$_2$— is optionally substituted with —O—, and two adjacent —CH$_2$— are not substituted with —O—. The alkylene group preferably has 1 to 4 carbon atoms.

Examples of such an aryl group include phenyl, halogenated phenyl, 4-methylphenyl, 4-ethylphenyl, 4-butylphenyl, 4-octylphenyl, 2,4-dimethylphenyl, 4-methoxyphenyl, 4-butoxyphenyl, 4-trifluoromethylphenyl, 4-trifluoromethoxyphenyl, 3-chloro-4-methylphenyl, 3,5-dichloro-4-methylphenyl, and 2,3-difluoro-4-methoxyphenyl. Among these, phenyl is particularly preferable.

Examples of the above arylalkyl groups include phenylmethyl, phenylethyl, 3-phenylpropyl, 4-phenylbutyl, 4-chlorophenylmethyl, 4-fluorophenylmethyl, 2-(4-fluorophenyl)propyl, 2-(4-chlorophenyl)ethyl, 4-methylphenylmethyl, 2-(4-methylphenyl)ethyl, 2-(2,5-dimethylphenyl)ethyl, 4-trifluoromethylphenylmethyl, 2-(4-trifluoromethylphenyl)ethyl, 2-(4-ethenylphenyl)ethyl, 4-methoxyphenylmethyl, 4-ethoxyphenylmethyl, 2-(4-methoxyphenyl)ethyl, 3-(4-methoxyphenyl)propyl, 2-chloro-4-methylphenylmethyl, and 2,5-dichloro-4-methylphenylmethyl.

In Formula (1), Y$^1$ is a group represented by Formula (a). In Formula (2), Y$^2$ is a group represented by Formula (b) or Formula (c). In consideration of production cost, in Formula (2), two Y$^2$ are preferably the same group, but they may be different groups.

[Chem. 11]

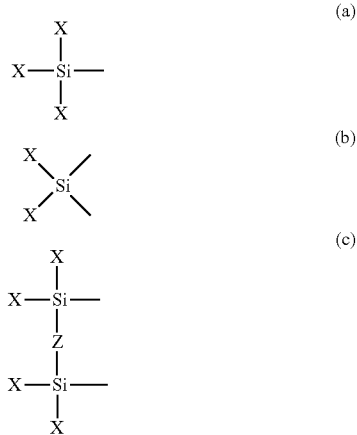

In Formula (a), Formula (b) and Formula (c), X independently represent a cyclopentyl group, a cyclohexyl group, an alkyl group having 1 to 10 carbon atoms in which any hydrogen atom is optionally substituted with a fluorine group and one —CH$_2$— is optionally substituted with —O—, a phenyl group in which any hydrogen atom is optionally substituted with a halogen atom or an alkyl group having 1 to 10 carbon atoms, a phenylalkyl group including a phenyl group in which any hydrogen atom is optionally substituted with a halogen atom or an alkyl group having 1 to 10 carbon atoms and an alkylene group having 1 to 4 carbon atoms, or a group including oxiranyl, oxiranylene, succinic anhydride, phthalic anhydride, or 3,4-epoxycyclohexyl. In this case, in an alkyl group having 1 to 10 carbon atoms which is a substituent of the phenyl group, any hydrogen atom is optionally substituted with a fluorine atom, and any —CH$_2$— is optionally substituted with —O—, and one —CH$_2$— is optionally substituted with —O— in the alkylene group in the phenylalkyl group. Thus, in Formula (a), Formula (b) and Formula (c), at least one X is a group including oxiranyl, oxiranylene, succinic anhydride, phthalic anhydride, or 3,4-epoxycyclohexyl.

Thus, in Formula (a), Formula (b) and Formula (c), one of X is a group including oxiranyl, oxiranylene, succinic anhydride, phthalic anhydride, or 3,4-epoxycyclohexyl, and the remaining X is preferably a group selected from among a cyclopentyl group, a cyclohexyl group, an alkyl group having 1 to 10 carbon atoms in which any hydrogen atom is optionally substituted with a fluorine group and one —CH$_2$— is optionally substituted with —O—, a phenyl group in which any hydrogen atom is optionally substituted with a halogen group or an alkyl group having 1 to 10 carbon atoms, and a phenylalkyl group including a phenyl group in which any hydrogen atom is optionally substituted with a halogen atom or an alkyl group having 1 to 10 carbon atoms, and an alkylene group having 1 to 4 carbon atoms.

Preferred ranges for Formulae (1) and (2) with respect to R and X are as shown below. That is, R independently represent a cyclohexyl group, a phenyl group in which any hydrogen atom is optionally substituted with a halogen atom or an alkyl group having 1 to 4 carbon atoms, or a phenylalkyl group including a phenyl group in which any hydrogen atom is optionally substituted with a halogen atom or an alkyl group having 1 to 4 carbon atoms and an alkylene group having 1 to 4 carbon atoms; and in the alkyl group having 1 to 4 carbon atoms which is a substituent of the phenyl group, any hydrogen atom is optionally substituted with a fluorine atom and one —CH$_2$— is optionally substituted with —O—; X independently represent an alkyl group having 1 to 4 carbon atoms, a fluorinated alkyl group having 1 to 4 carbon atoms, a cyclopentyl group, a cyclohexyl group, a phenyl group in which any hydrogen atom is optionally substituted with a halogen atom or an alkyl group having 1 to 4 carbon atoms, a phenylalkyl group including a phenyl group in which any hydrogen atom is optionally substituted with a halogen atom or an alkyl group having 1 to 4 carbon atoms and an alkylene group having 1 to 4 carbon atoms, or a group including oxiranyl, oxiranylene, succinic anhydride, phthalic anhydride, or 3,4-epoxycyclohexyl; in the alkyl group having 1 to 4 carbon atoms which is a substituent of the phenyl group, any hydrogen atom is optionally substituted with a fluorine atom and any —CH$_2$— is optionally substituted with —O—; thus, in Formula (a), Formula (b) and Formula (c), at least one X is a group including oxiranyl, oxiranylene, succinic anhydride, phthalic anhydride, or 3,4-epoxycyclohexyl.

Further preferred ranges for Formula (1) and Formula (2) with respect to R and X are shown below. That is, R represents a cyclohexyl group, a phenyl group in which any hydrogen atom is optionally substituted with a halogen atom or an alkyl group having 1 to 4 carbon atoms, or a phenylalkyl group including a phenyl group in which any hydrogen atom is optionally substituted with a halogen atom or an alkyl group having 1 to 4 carbon atoms and an alkylene group having 1 to 4 carbon atoms; in the alkyl group having 1 to 4 carbon atoms which is a substituent of the phenyl group, any hydrogen atom is optionally substituted with a fluorine atom and one —CH$_2$— is optionally substituted with —O—; in Formula (a), Formula (b) and Formula (c), one of X is a group including oxiranyl, oxiranylene, succinic anhydride, phthalic anhydride, or 3,4-epoxycyclohexyl, and the remaining X is an alkyl group having 1 to 4 carbon atoms, a fluorinated alkyl group having 1 to 4 carbon atoms, a cyclopentyl group, a cyclohexyl group, a phenyl group in which any hydrogen atom is optionally substituted with a halogen atom or an alkyl group having 1 to 4 carbon atoms, or a phenylalkyl group including a phenyl group in which any hydrogen atom is optionally substituted with a halogen atom or an alkyl group having 1 to 4 carbon atoms and an alkylene group having 1 to 4 carbon atoms; in the alkyl group having 1 to 4 carbon atoms which is a substituent of the phenyl group, any hydrogen atom is optionally substituted with a fluorine atom and any —CH$_2$— is optionally substituted with —O—.

More preferred ranges for Formula (1) and Formula (2) with respect to R and X are as follows. That is, R is a cyclohexyl or phenyl group; and in Formula (a), Formula (b) and Formula (c), one of X is a group including oxiranyl, succinic anhydride, phthalic anhydride, or 3,4-epoxycyclohexyl, and the remaining X is a methyl, ethyl, t-butyl, cyclopentyl, cyclohexyl or phenyl group.

Particularly preferred ranges for Formula (1) and Formula (2) with respect to R and X are as follows. That is, R is a phenyl group; and in Formula (a), Formula (b) and Formula (c), one of X is a group including oxiranyl, succinic anhydride, phthalic anhydride, or 3,4-epoxycyclohexyl, and the remaining X is a methyl or phenyl group.

Preferable examples of the group including oxiranyl, oxiranylene, succinic anhydride, phthalic anhydride, or 3,4-epoxycyclohexyl are shown below.

[Chem. 12]

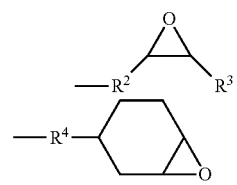

In these formulae, R$^2$ and R$^4$ are an alkylene group having 1 to 6 carbon atoms. In this alkylene group, one —CH$_2$— is optionally substituted with —O— or 1,4-phenylene. Thus, R$^3$ is a hydrogen atom or an alkyl group having 1 to 6 carbon atoms.

Among these, a group including any one of oxiranyl, succinic anhydride, phthalic anhydride, and 3,4-epoxycyclohexyl is more preferable.

Particularly preferable examples of X are groups represented by Formula (3), Formula (4) and Formula (5).

[Chem. 13]

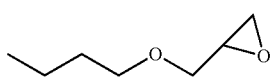

(3)

-continued
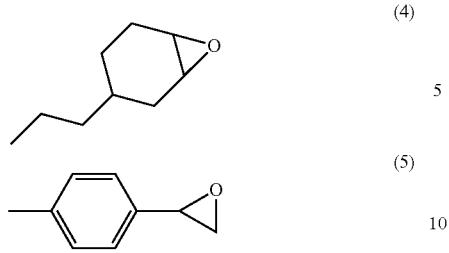
Specific examples of Compound (1) and Compound (2) are as follows.
In Formula (1-1) to (3-1), Me represents a methyl group, and Ph represents a phenyl group.
[Chem. 14]
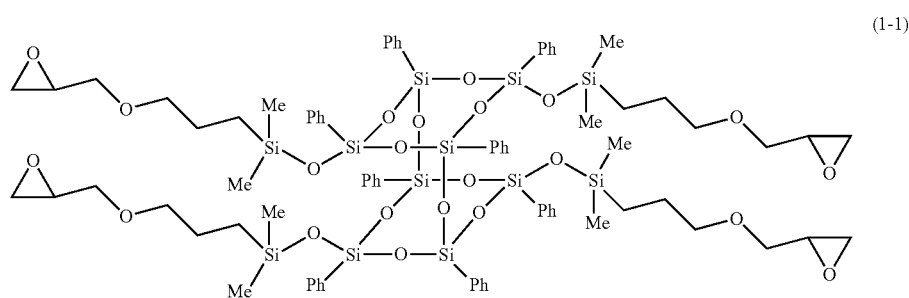
(1-1)
[Chem. 15]
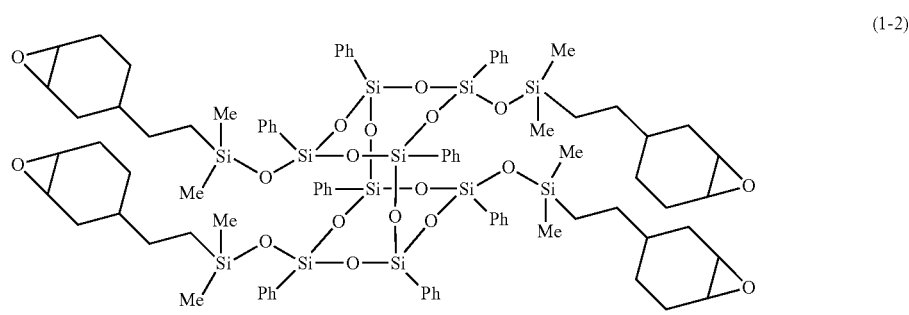
(1-2)
[Chem. 16]
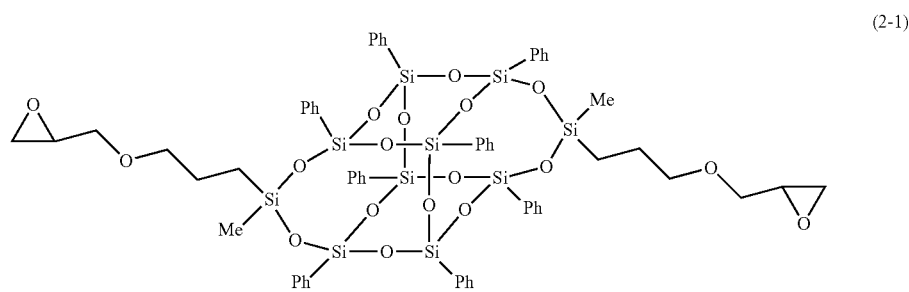
(2-1)

[Chem. 17]

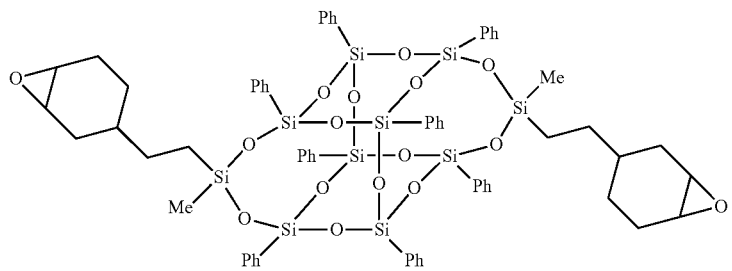

(2-2)

[Chem. 18]

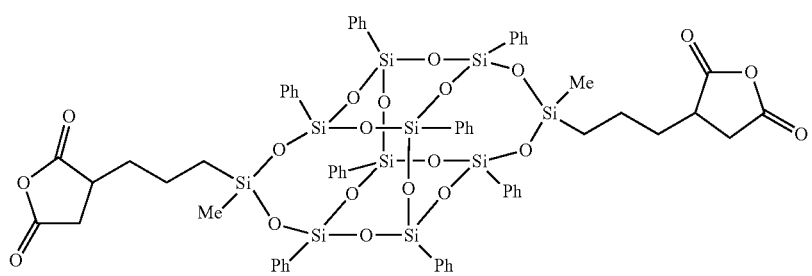

(3-1)

These silsesquioxanes can be easily obtained with reference to Japanese Patent No. 5013127, Japanese Patent No. 5408597, Japanese Patent No. 4379120, and Japanese Patent No. 4483344.

The silsesquioxane used in the present invention preferably has a bifunctional or higher functional group for forming a bond with a coupling agent, a trifunctional or higher functional group, or a tetrafunctional or higher functional group. In addition, a compound having a functional group at both ends of the long side of the silsesquioxane is preferable because a linear bond can then be formed.

Examples of a combination of functional groups that can form a bond between a silsesquioxane and a coupling agent include a combination of an oxiranyl group and an amino group, a combination of vinyl groups, a combination of methacryloxy groups, a combination of a carboxy or carboxylic acid anhydride residue and an amino group, and a combination of imidazole and an oxiranyl group, but the present invention is not limited thereto. A combination with high heat resistance is more preferable.

<Inorganic Fillers>

Examples of the first inorganic filler and second inorganic filler include a nitride, a carbide, a carbon material, a metal oxide, and a silicate mineral. The first inorganic filler and the second inorganic filler may be the same as or different from each other.

Specifically, regarding the first inorganic filler and the second inorganic filler, examples of an inorganic filler having high thermal conductivity and a very small or negative thermal expansion coefficient include boron nitride, boron carbide, boron carbonitride, graphite, carbon fibers, and carbon nanotubes. In addition, alumina, silica, magnesium oxide, zinc oxide, iron oxide, ferrite, mullite, cordierite, silicon nitride, and silicon carbide can be exemplified.

In addition, the following inorganic filler having a high thermal conductivity and a positive thermal expansion coefficient may be used as either the first inorganic filler or the second inorganic filler.

Examples of a third inorganic filler include an inorganic filling material and a metal filling material such as alumina, silica, boron nitride, boron carbide, silicon carbide, aluminum nitride, silicon nitride, diamond, carbon nanotubes, graphite, graphene, silicon, beryllia, magnesium oxide, aluminum oxide, zinc oxide, silicon oxide, copper oxide, titanium oxide, cerium oxide, yttrium oxide, tin oxide, holmium oxide, bismuth oxide, cobalt oxide, calcium oxide, magnesium hydroxide, aluminum hydroxide, gold, silver, copper, platinum, iron, tin, lead, nickel, aluminum, magnesium, tungsten, molybdenum, and stainless steel, which have high thermal conductivity, have a positive thermal expansion coefficient or a smaller size than the first and second inorganic fillers.

It is desirable that a structure of the silsesquioxane have a shape and a length at which these inorganic fillers can be efficiently directly bonded to each other. A type, a shape, a size, and an addition amount of an inorganic filler can be appropriately selected depending on the purpose. When insulation properties are necessary for the obtained heat-dissipating member, an inorganic filler having conductivity may be used as long as desired insulation properties are maintained. Examples of the shape of the inorganic filler include a plate shape, a spherical shape, an amorphous shape, a fibrous shape, a rod shape, and a tubular shape.

Boron nitride, aluminum nitride, silicon nitride, silicon carbide, graphite, carbon fibers, and carbon nanotubes are preferable. In particular, hexagonal boron nitride (h-BN) and graphite are preferable. Boron nitride and graphite are preferable because they have very high thermal conductivity in the planar direction, and boron nitride has a low dielectric constant and has strong insulation properties. For example, plate-like crystal boron nitride is preferably used because the plate-like structure is likely to be aligned according to a mold due to a flow and a pressure of a raw material during molding and curing.

An average particle size of the inorganic filler is preferably 0.1 to 200 μm, and more preferably, 1 to 100 μm. When the average particle size is 0.1 μm or more, thermal conductivity is favorable, and when the average particle size is 200 μm or less, a filling rate can increase.

Here, in this specification, the average particle size is based on particle size distribution measurement using a laser diffraction and scattering method. That is, using analysis according to the Fraunhofer diffraction theory and the Mie scattering theory, powder is divided into two sides from a certain particle size using a wet method, and a size at which the larger side and the smaller side are equal (based on the volume) is set as a median size.

Proportions of the inorganic filler, the coupling agent and the silsesquioxane depend on an amount of the coupling agent bonded to the inorganic filler used. A compound used as the first and second inorganic fillers (for example, boron nitride) does not have a reactive group on its surface as described above and has a reactive group only on its side. Preferably, as much coupling agent as possible is bonded to few reactive groups, and the same number of or slightly more organic compound molecules as or than the number of reactive groups are bonded thereto. An amount of the coupling agent reacted with the inorganic filler varies mainly depending on the size of the inorganic filler and the reactivity of the coupling agent used. For example, when the inorganic filler is larger, since an area ratio of the side of the inorganic filler is smaller, an amount of modification is smaller. Although it is desirable to react as much coupling agent as possible, when particles become smaller, since thermal conductivity of the product is lowered, it is preferable to keep a balance.

A volume ratio between a silane coupling agent and a silsesquioxane in the heat-dissipating member which is a cured product and the inorganic component is desirably in a range of 5:95 to 30:70, and more desirably in a range of 10:90 to 25:75. The inorganic component is an inorganic raw material before a silane coupling agent treatment or the like is performed.

<Coupling Agent>

In a coupling agent bonded to the inorganic filler, when a functional group of a bifunctional or higher silsesquioxane group is oxiranyl, acid anhydride residue, or the like, since it is preferable that the coupling agent react with these functional groups, it is preferable that the coupling agent have an amine reactive group at the terminus. Examples of the coupling agent include Sila-Ace (registered trademark) 5310, S320, S330, and 5360 (commercially available from JNC) and KBM903 and KBE903 (commercially available from Shin-Etsu Chemical Co., Ltd.).

Here, when the terminus of the bifunctional or higher silsesquioxane is an amine, a coupling agent having an oxiranyl group or the like at the terminus is preferable. Examples of the coupling agent include Sila-Ace (registered trademark) S510 and S530 (commercially available from JNC). Here, modification of inorganic fillers using a coupling agent is preferable because the number of bonds increases as the number of modifications increases.

The first coupling agent and the second coupling agent may be the same as or different from each other.

As the first inorganic filler, an inorganic filler that is treated with a coupling agent and then additionally subjected to a surface modification with a bifunctional or higher silsesquioxane is used. For example, in the inorganic filler (inorganic filler bonded to a coupling agent) treated with a silane coupling agent, a bifunctional or higher silsesquioxane may be additionally bonded to the coupling agent, and thus the inorganic filler is subjected to surface modification with a silsesquioxane. As shown in FIG. 2, the first inorganic filler subjected to surface modification with a silsesquioxane can form a bond with the second inorganic filler using the silsesquioxane and the coupling agent, and the bond greatly contributes to thermal conduction.

Here, as the first inorganic filler, a filler that is subjected to a coupling treatment using a coupling agent bonded to a bifunctional or higher silsesquioxane in advance may be used.

As the bifunctional or higher silsesquioxane, bifunctional or higher silsesquioxanes represented by the above Formulae (1) and (2) are preferable. However, other silsesquioxanes may be used. When the silsesquioxane is polycyclic, this is desirable because the heat resistance is high, and when the linearity is high, elongation and fluctuation due to heat between inorganic fillers are small, and moreover, it is possible to efficiently transfer heat phonon conduction. Here, when an amount of surface modification using a silsesquioxane or the like is excessively small, since the number of molecules that bond fillers is excessively small, the strength decreases. On the other hand, when an amount of surface modification using a silsesquioxane or the like is excessively large, properties of a resin such as exhibition of a glass transition temperature are strongly exhibited. Therefore, depending on required properties, it is desirable to appropriately adjust an amount of surface modification.

<Other Components>

The composition for a heat-dissipating member may further contain an organic compound (for example, a polymerizable compound or a polymer compound) that is not bonded to the first inorganic filler and the second inorganic filler, that is, does not contribute to bonding, and may contain a polymerization initiator, a solvent, and the like.

<Polymerizable Compound that is not Bonded>

The composition for a heat-dissipating member may contain a silsesquioxane (in this case, it need not be a bifunctional or higher silsesquioxane) that is not bonded to an inorganic filler as a component. As such a silsesquioxane, a silsesquioxane that does not prevent thermal curing of the inorganic filler and does not evaporate or bleed out due to heat is preferable. In addition, another polymerizable compound that is not bonded to the inorganic filler may be included as a component. Polymerizable compounds are classified into compounds having no liquid crystallinity and compounds having liquid crystallinity. Examples of the polymerizable compound having no liquid crystallinity include vinyl derivatives, styrene derivatives, (meth)acrylic acid derivatives, sorbic acid derivatives, fumaric acid derivatives, and itaconic acid derivatives. Regarding a content, first, desirably, a composition for a heat-dissipating member that does not contain a compound which is not bonded is produced, a porosity thereof is measured, and the compound is added in an amount at which voids are filled.

<Polymer Compound that is not Bonded>

The composition for a heat-dissipating member may contain a polymer compound that is not bonded to an inorganic filler as a component. As such a polymer compound, a compound that does not degrade film forming properties and mechanical strength is preferable. The polymer compound may be a polymer compound that does not react with the inorganic filler, the coupling agent, and silsesquioxane. For example, when the silsesquioxane is oxiranyl and the silane coupling agent has an amino group, a polyolefin resin, a polyvinyl resin, a silicone resin, wax, and the like are exemplified. Regarding a content, first, desirably, a composition for a heat-dissipating member that does not contain a polymer compound which is not bonded is produced, a porosity thereof is measured, and the polymer compound is added in an amount at which voids are filled.

<Non-Polymerizable Liquid Crystalline Compound>

The composition for a heat-dissipating member may contain a liquid crystalline compound having no polymerizable group as a component. Examples of such a non-polymerizable liquid crystalline compound are described in the liquid crystalline compound database LiqCryst (LCI Publisher GmbH, Hamburg, Germany), and the like. When the composition containing a non-polymerizable liquid crystalline compound is polymerized, for example, it is possible to obtain composite materials of Compounds (1) and (2) and the liquid crystalline compound. In such composite materials, a non-polymerizable liquid crystalline compound is present in a polymer network. Therefore, a liquid crystalline compound having properties such that it has no fluidity in a temperature range in which it is used is desirable. Combining may be performed in such a manner in which, after the inorganic filler is cured, it is injected into voids in a temperature range in which an isotropic phase is exhibited or inorganic fillers may be polymerized by mixing in an amount of the liquid crystalline compound computed in advance such that voids are filled in the inorganic fillers.

<Polymerization Initiator>

The composition for a heat-dissipating member may contain a polymerization initiator as a component. As the polymerization initiator, according to components and a polymerization method of the composition, for example, a photo radical polymerization initiator, a photocationic polymerization initiator, and a thermal radical polymerization initiator may be used. In particular, since the inorganic filler absorbs ultraviolet rays, a thermal radical polymerization initiator is preferable.

Examples of a preferable initiator for thermal radical polymerization include benzoyl peroxide, diisopropyl peroxydicarbonate, t-butylperoxy-2-ethylhexanoate, t-butyl peroxypivalate, di-t-butyl peroxide (DTBPO), t-butyl peroxydiisobutyrate, lauroyl peroxide, dimethyl 2,2'-azobisisobutyrate (MAIB), azobisisobutyronitrile (AIBN), and azobiscyclohexanecarbonitrile (ACN).

<Solvent>

The composition for a heat-dissipating member may contain a solvent. When a component that needs to be polymerized is contained in the composition, polymerization may be performed in a solvent or without a solvent. The composition containing a solvent may be applied onto a substrate, using, for example, a spin coating method, and then photopolymerized after the solvent is removed. Alternatively, after photocuring, heating may be performed to an appropriate temperature, curing may be performed by heating and thus a post treatment may be performed.

Examples of a preferable solvent include benzene, toluene, xylene, mesitylene, hexane, heptane, octane, nonane, decane, tetrahydrofuran, γ-butyrolactone, N-methyl pyrrolidone, dimethylformamide, dimethylsulfoxide, cyclohexane, methylcyclohexane, cyclopentanone, cyclohexanone, and PGMEA. The above solvents may be used alone, or two or more types thereof may be used in combination.

Here, there is little point in limiting a proportion of a solvent used during polymerization. In consideration of polymerization efficiency, solvent cost, energy cost, and the like, the proportion may be determined for each case.

<Others>

In order to facilitate handling, a stabilizer may be added to the composition for a heat-dissipating member. As such a stabilizer, a known stabilizer can be used without limitation. Examples of the stabilizer include hydroquinone, 4-ethoxyphenol, and 3,5-di-t-butyl-4-hydroxytoluene (BHT).

In addition, an additive (such as an oxide) may be added in order to adjust the viscosity or color of the composition for a heat-dissipating member. For example, titanium oxide for exhibiting white, carbon black for exhibiting black, and a fine silica powder for adjusting the viscosity can be exemplified. In addition, an additive may be added in order to further increase mechanical strength. For example, as inorganic fibers such as glass fibers, carbon fibers, and carbon nanotubes, cloth, or a polymer additive, fibers or long molecules of polyvinyl formal, polyvinyl butyral, polyester, polyamide, and polyimide may be exemplified.

<Production Method>

A method for producing a composition for a heat-dissipating member and a method for producing a heat-dissipating member from the composition will be described below in detail.

(1) Performing a Coupling Treatment

A coupling treatment is performed on an inorganic filler, and a form in which one end of a coupling agent is bonded to an inorganic filler is referred to as a second inorganic filler. The coupling treatment can be performed using a known method.

As an example, first, the inorganic filler and the coupling agent are added to a solvent. After stirring is performed using a stirrer or the like, drying is performed. After the solvent is dried, a heat treatment is performed under vacuum conditions using a vacuum dryer or the like. A solvent is added to the inorganic filler and pulverization is performed using an ultrasonic treatment. This solution is separated and purified using a centrifuge. After the supernatant is discarded, the solvent is added, and the same operation is performed several times. The inorganic filler subjected to a coupling treatment after purification is dried using an oven.

(2) Modification with Silsesquioxane

A bifunctional or higher silsesquioxane is bonded to the other end of the coupling agent of the inorganic filler (that may be the same as or different from the above second inorganic filler) subjected to a coupling treatment. The inorganic filler modified with the silsesquioxane in this manner is referred to as a first inorganic filler.

As an example, the inorganic filler subjected to a coupling treatment and a bifunctional or higher silsesquioxane are mixed using an agate mortar or the like, and kneading is then performed using two rollers. Then, separation and purification are performed through an ultrasonic treatment and centrifugation.

(3) Mixing

The first inorganic filler and the second inorganic filler are weighed out such that, for example, weights of only the inorganic fillers are 1:1 (weight ratio), and mixing is performed using an agate mortar or the like. Then, mixing is performed using two rollers and the like, and a composition for a heat-dissipating member is obtained.

Regarding a mixing ratio between the first inorganic filler and the second inorganic filler, when bond groups that form a bond between the first inorganic filler and the second inorganic fillers are amino:epoxy groups, for example, weights of only the inorganic fillers are preferably 1:1 to 1:30, and more preferably 1:3 to 1:20. The mixing ratio is determined according to the number of terminal bond groups that form a bond between the first inorganic filler and the second inorganic fillers. For example, in the case of a secondary amine, since it can react with two oxiranyl groups, it may be used in a smaller amount compared to the oxiranyl side, and since the oxiranyl side may be ring-opened, a greater amount than that computed from the epoxy equivalent is preferably used.

(4) Producing a Heat-Dissipating Member

As an example, a method for producing a film as a heat-dissipating member using a composition for a heat-dissipating member will be described. A composition for a heat-dissipating member is inserted between heating plates using a compression molding machine and aligned, cured and molded by compression molding. In addition, post-curing is performed using an oven or the like, and a heat-dissipating member of the present invention is obtained. Here, a pressure during compression molding is preferably 50 to 200 kgf/cm$^2$ and more preferably 70 to 180 kgf/cm$^2$. Basically, a higher pressure during curing is preferable. However, a pressure is appropriately changed according to the fluidity of the mold and desired physical properties (in which direction to emphasize the thermal conductivity in), and an appropriate pressure is preferably applied.

Hereinafter, a method for producing a film as a heat-dissipating member using a composition for a heat-dissipating member containing a solvent will be described in detail.

First, the composition is applied to the substrate, the solvent is dried and removed, and a coating layer with a uniform film thickness is formed. Examples of the coating method include spin coating, roll coating, curtain coating, flow coating, printing, micro gravure coating, gravure coating, wire bar coating, dip coating, spray coating, and a meniscus coating method.

The solvent can be dried and removed by, for example, air-drying at room temperature, drying on a hot plate, drying in a drying furnace, blowing warm air or hot air, or the like. Conditions for removing the solvent are not particularly limited, and it is sufficient to perform drying until the solvent is substantially removed and the fluidity of a coating layer disappears.

Examples of the substrate include metal substrates of copper, aluminum, iron and the like; inorganic semiconductor substrates of silicon, silicon nitride, gallium nitride, and zinc oxide; glass substrates of alkali glass, borosilicate glass, and flint glass; inorganic insulating substrates of alumina and aluminum nitride; and plastic film substrates of polyimide, polyamideimide, polyamide, polyetherimide, polyether ether ketone, polyether ketone, polyketone sulfide, polyethersulfone, polysulfone, polyphenylene sulfide, polyphenylene oxide, polyethylene terephthalate, polybutylene terephthalate, polyethylene naphthalate, polyacetal, polycarbonate, polyarylate, an acrylic resin, polyvinyl alcohol, polypropylene, cellulose, triacetyl cellulose, and partially saponified products thereof, and an epoxy resin, a phenol resin, a norbornene resin, and the like.

The film substrate may be a uniaxially stretched film or a biaxially stretched film. The film substrate may be subjected to a surface treatment such as a saponification treatment, a corona treatment, or a plasma treatment in advance. Here, on such film substrates, a protective layer that is not affected by the solvent contained in the composition for a heat-dissipating member may be formed. Examples of a material used for the protective layer include a polyvinyl alcohol. In addition, an anchor coat layer may be formed in order to improve the adhesion between the protective layer and the substrate. For such an anchor coat layer, any of inorganic and organic materials may be used as long as it can improve the adhesion between the protective layer and the substrate.

A case in which a bond between the inorganic fillers is composed of an inorganic filler subjected to a coupling treatment and an inorganic filler that is subjected to a coupling treatment and further modified with a silsesquioxane has been described above. Specifically, for example, the second inorganic filler is subjected to a coupling treatment using a silane coupling agent having an amino group. After the first inorganic filler is subjected to a coupling treatment using a silane coupling agent having an amino group, the amino group and one end of the bifunctional or higher silsesquioxane having an epoxy group at both ends are bonded to each other. Finally, the amino group on the side of the second inorganic filler and the other epoxy group of the silsesquioxane on the side of the first inorganic filler are bonded to each other (refer to FIG. 2). Here, a combination in which the inorganic filler side has an epoxy group and the silsesquioxane side has an epoxy group may be used.

As another method, a coupling agent modified with a bifunctional or higher silsesquioxane in advance can be used. For example, the second inorganic filler is subjected to a coupling treatment using a silane coupling agent having an amino group. Next, a silane coupling agent having a vinyl group is modified with a silsesquioxane having a vinyl group and an epoxy group at the terminus, and the first inorganic filler is then subjected to a coupling treatment using the modified silane coupling agent. Finally, the amino group on the side of the second inorganic filler and the epoxy group of the silsesquioxane on the side of the first inorganic filler are bonded to each other.

In addition, as another method, the first and second inorganic fillers treated with a coupling agent and the bifunctional or higher silsesquioxane computed from an amount of modification of the coupling agent may be mixed and pressed. When heating is performed while performing pressing, first, the silsesquioxane has fluidity and enters gaps of the inorganic fillers. When additional heating is performed, the silsesquioxane is bonded to the coupling agent, and a bond between the first inorganic filler and the second inorganic filler can be formed (that is, cured).

Figure 3:
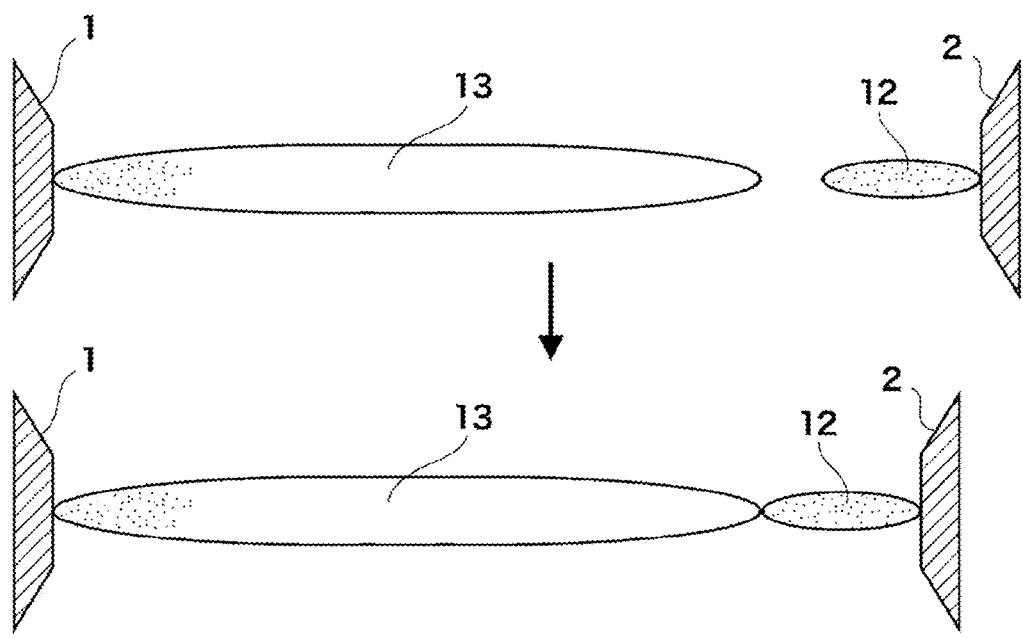
FIG. 3 is a conceptual diagram showing a state in which, through curing treatment of a composition of a heat-dissipating member, the other end of the first coupling agent 11 is bonded to the other end of the second coupling agent 12.
Figure 4:
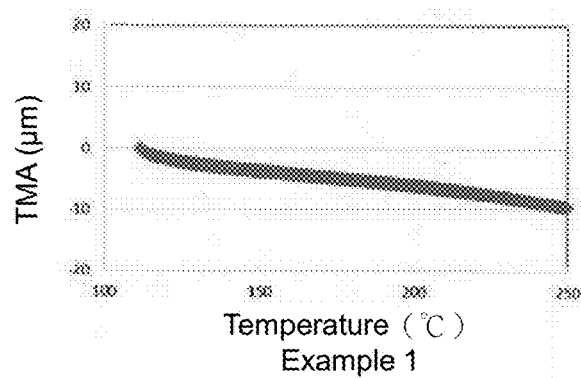
FIG. 4 is a graph showing measurement results of a thermal expansion coefficient of Example 1.
Figure 5:
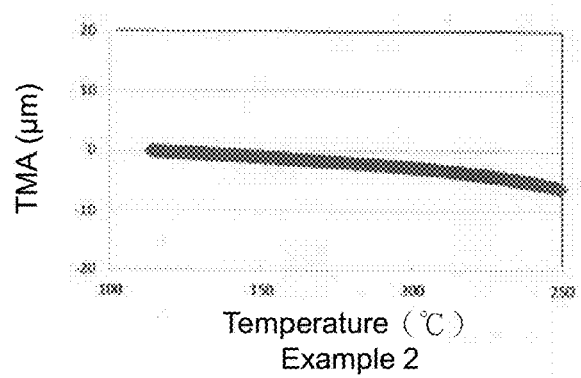
FIG. 5 is a graph showing measurement results of a thermal expansion coefficient of Example 2.
Figure 6:
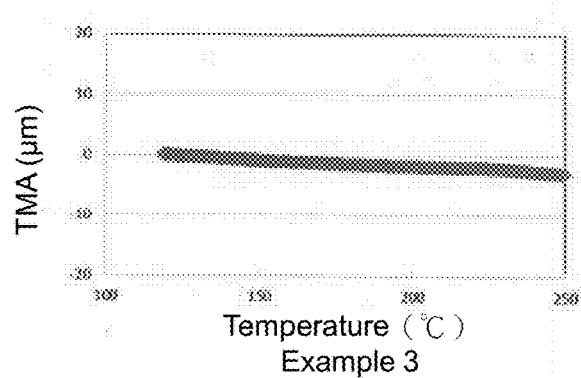
FIG. 6 is a graph showing measurement results of a thermal expansion coefficient of Example 3.
Figure 7:
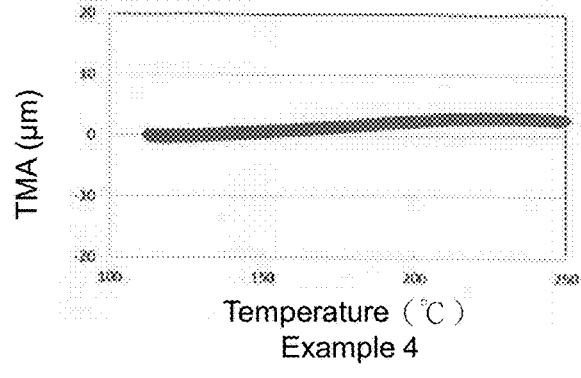
FIG. 7 is a graph showing measurement results of a thermal expansion coefficient of Example 4.
Figure 8:
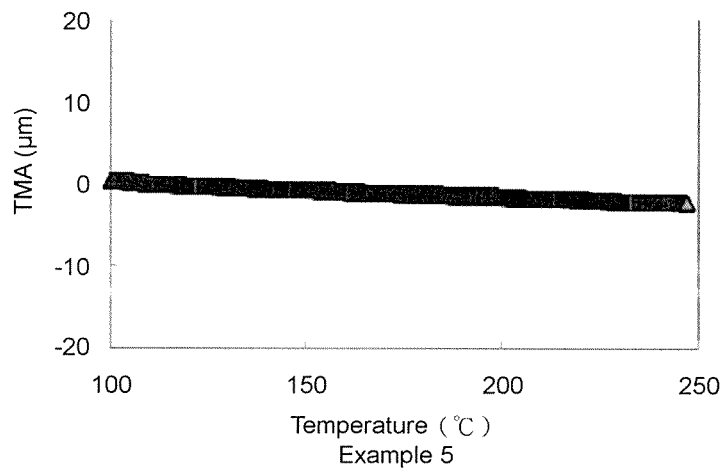
FIG. 8 is a graph showing measurement results of a thermal expansion coefficient of Example 5.
Figure 9:
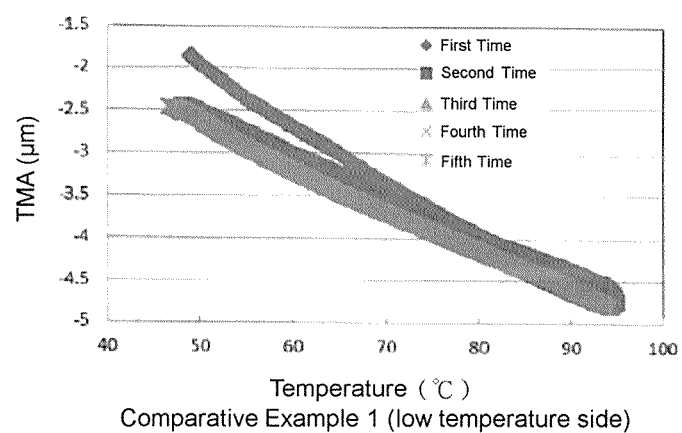
FIG. 9 is a graph showing measurement results of a thermal expansion coefficient of Comparative Example 1 (low temperature side).
Figure 10:
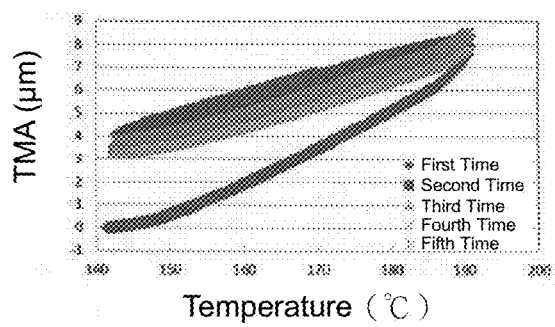
FIG. 10 is a graph showing measurement results of a thermal expansion coefficient of Comparative Example 1 (high temperature side).

For example, as shown in FIG. 3, the composition for a heat-dissipating member of the present invention may be a composition including a first inorganic filler 1 bonded to one end of a first coupling agent 13; and a second inorganic filler 2 bonded to one end of the second coupling agent 12. The other end of the first coupling agent 13 and the other end of the second coupling agent 12 are not bonded to each other.

As shown in FIG. 3, when the composition for a heat-dissipating member is cured, the other end of the first coupling agent 13 is bonded to the other end of the second coupling agent 12.

In this manner, a bond between the inorganic fillers may be formed according to a bond between coupling agents. For example, the first inorganic filler is subjected to a coupling treatment using a silane coupling agent having an amino group. The second inorganic filler is subjected to a coupling treatment using a silane coupling agent having an epoxy group. Finally, the amino group on the side of the first inorganic filler and the epoxy group on the side of the second inorganic filler are bonded to each other. In this manner, the coupling agent bonded to the first inorganic filler and the coupling agent bonded to the second inorganic filler each have a functional group for bonding coupling agents. The functional group on the side of the first inorganic filler and the functional group on the side of the second inorganic filler may be a combination of different types of functional groups or a combination of the same type of functional group as long as it is possible to bond coupling agents to each other.

Examples of a combination of functional groups that form a bond between coupling agents include a combination of an oxiranyl group and an amino group, a combination of vinyl groups, a combination of methacryloxy groups, a combination of a carboxy or carboxylic acid anhydride residue and an amino group, and a combination of imidazole and an oxiranyl group, but the present invention is not limited thereto. A combination with high heat resistance is more preferable.

In a form in which a bond between the inorganic fillers is formed according to a bond between coupling agents, at least one of the coupling agents preferably contains a silsesquioxane in its structure.

<Method for Producing a Silane Coupling Agent Containing a Silsesquioxane in its Structure>

(1) Obtaining a Bifunctional or Higher Silsesquioxane

A bifunctional or higher silsesquioxane is obtained. The bifunctional or higher silsesquioxane preferably has a functional group at both ends. A bifunctional or higher silsesquioxane represented by the above Formulae (1) and (2) may be used. It is preferable that a functional group be provided at both ends on the long side of the silsesquioxane because it is possible to form a linear bond (crosslinking) using a coupling agent.

For example, the following Formula (4-1) having a vinyl group at both ends can be exemplified.

The bifunctional or higher silsesquioxane may be synthesized or a commercially available product may be purchased.

In Formula (4-1), Me represents a methyl group, and Ph represents a phenyl group.

[Chem. 19]

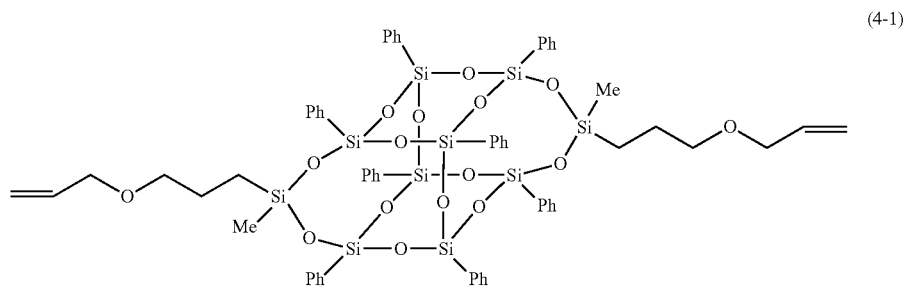

(4-1)

(2) Introducing a Polymerizable Group into any One End of the Silsesquioxane

For example, a case in which an epoxy group is introduced as a polymerizable group will be described. In a reaction in which an epoxy group is introduced (epoxidized) into both ends of the above Formula (4-1) and the following Formula (4-4) is generated, when the reaction is stopped midway, the following Formulae (4-2) and (4-3) having an epoxy group at any one end can be obtained as an intermediate product. The generated following Formulae (4-2) and (4-3) can be obtained by dissolving in a solvent, performing separation using a separator, and then removing the solvent. In this manner, a desired polymerizable group is introduced into any one end by removing the intermediate product.

In Formulae (4-2) to (4-4), Me represents a methyl group, and Ph represents a phenyl group.

[Chem. 20]

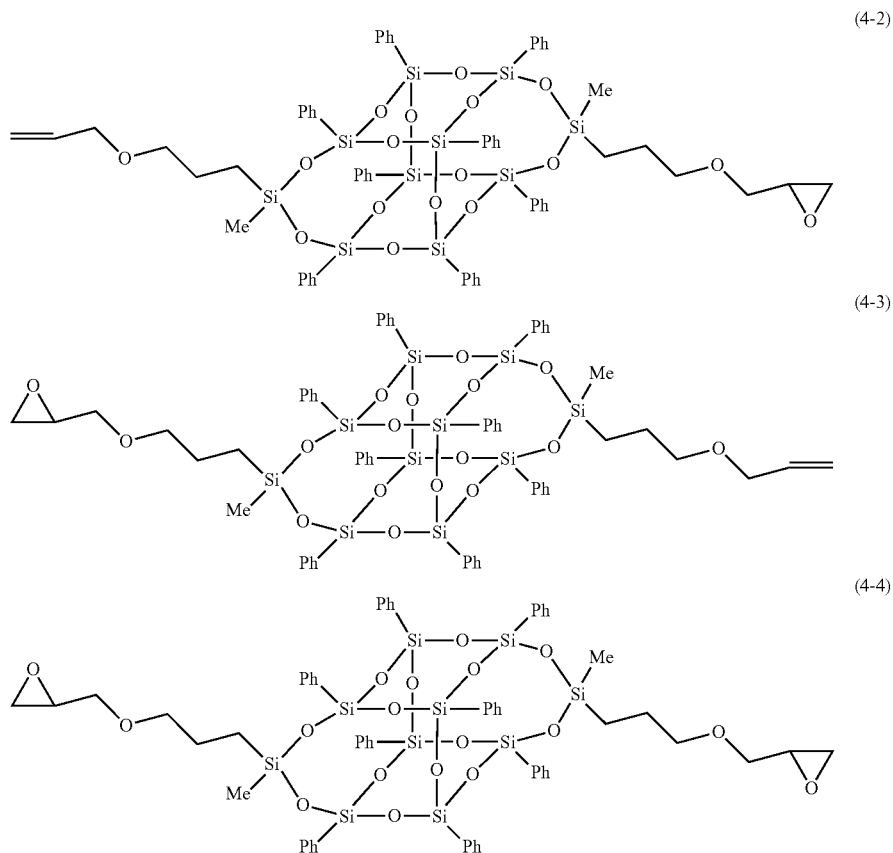

A solvent that removes the intermediate product may be any solvent in which the generated intermediate product can be dissolved. Examples of the solvent include ethyl acetate, benzene, toluene, xylene, mesitylene, hexane, heptane, octane, nonane, decane, tetrahydrofuran, γ-butyrolactone, N-methyl pyrrolidone, dimethylformamide, dimethylsulfoxide, cyclohexane, methylcyclohexane, cyclopentanone, cyclohexanone, and PGMEA. The above solvent may be used alone, or two or more types thereof may be used in combination. Here, there is little point in limiting a proportion of the solvent used. In consideration of solubility, solvent cost, energy cost, and the like, the proportion may be determined for each case.

(3) Introducing Si into an Unreacted End of a Silsesquioxane

A silicon compound having an alkoxy group may be bonded to an unreacted end of the silsesquioxane.

For example, trimethoxysilyl may be introduced into an unreacted functional group (vinyl) side of the above Formulae (4-2) and (4-3). The following Formulae (5-1) and (5-2) may be referred to. Here, introduction of Si may be introduction of a triethoxysilyl group. However, regarding methoxysilane and ethoxysilane, methoxysilane that is highly reactive is preferable.

In addition, some methoxy or ethoxy groups may be substituted with a linear or branched alkyl group having 1 to 8 carbon atoms. For example, methyl, ethyl, n-propyl, i-propyl, n-butyl, s-butyl, t-butyl, and n-octyl groups may be exemplified.

In Formulae (5-1) and (5-2), Me represents a methyl group, and Ph represents a phenyl group.

[Chem. 21]

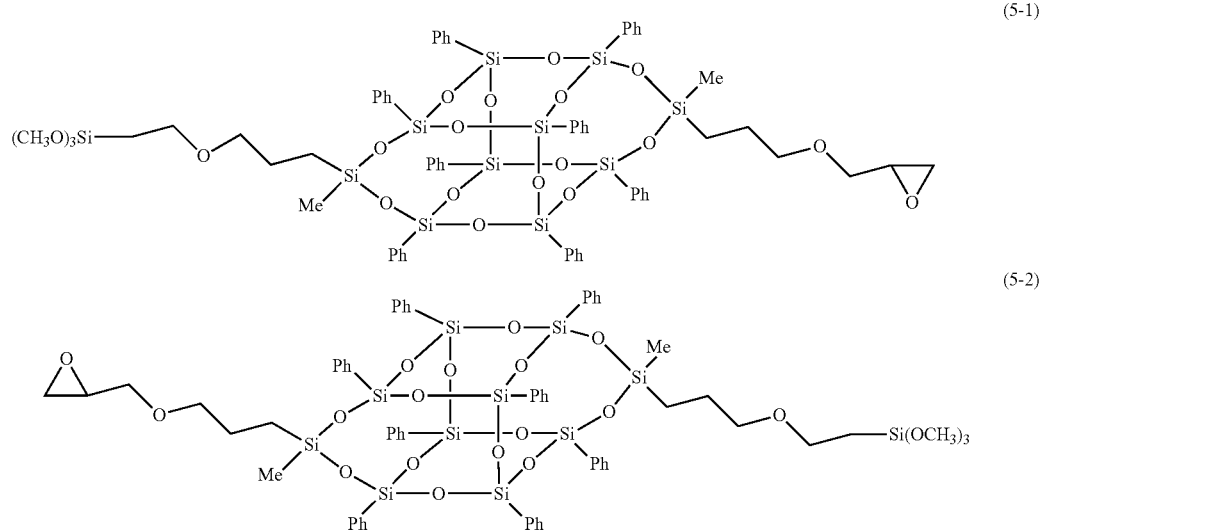

In a method for producing a silane coupling agent containing a silsesquioxane in the above structure, as an example, in a silsesquioxane having a vinyl group at both ends, first, a vinyl group at one end is epoxidized and next, Si is introduced into the other unreacted vinyl group for production. However, the production method is not limited thereto. Both ends of the silsesquioxane are not limited to a vinyl group as long as a polymerizable group and Si can be introduced.

In addition, while Si may be introduced into the above long chain compound using a hydrosilylation reaction, and a silane coupling agent containing a silsesquioxane in its structure may be synthesized such that the left half and the right half of a long chain compound are first separately synthesized, Si is introduced into the left half using a hydrosilylation reaction, a polymerizable group is introduced into the right half, and the left half and the right half are then connected to each other.

In this manner, when the coupling agent and the silsesquioxane are appropriately selected, it is possible to connect the first inorganic filler and the second inorganic filler. It is possible to obtain a heat-dissipating member having very high thermal conductivity and controllability of a thermal expansion coefficient from the composition for a heat-dissipating member of the present invention. Here, the above functional groups are only examples, and the present invention is not limited to the above functional groups as long as effects of the present are obtained.

[Heat-Dissipating Member]

A heat-dissipating member according to a second embodiment of the present invention is obtained by curing a composition for a heat-dissipating member and performing molding according to applications. The cured product has highly thermal conductivity and can have a negative or very small positive thermal expansion coefficient, and has excellent heat resistance, chemical stability, hardness and mechanical strength. Here, the mechanical strength refers to a Young's modulus, tensile strength, tear strength, bending strength, flexural modulus of elasticity, impact strength, or the like. The heat-dissipating member is suitable for a heat dissipation plate, a heat dissipation sheet, a heat dissipation film, a heat dissipation adhesive, and a heat dissipation molded article.

Regarding conditions for precuring in which a composition for a heat-dissipating member according to thermal polymerization, a thermosetting temperature is in a range of room temperature to 350° C., preferably in a range of room temperature to 250° C., and more preferably in a range of 50° C. to 200° C., and a curing time is in a range of 5 seconds to 10 hours, preferably in a range of 1 minute to 5 hours, and more preferably in a range of 5 minutes to 1 hour. After polymerization, preferably, gradual cooling is performed in order to reduce stress strain and the like. In addition, a reheating treatment may be performed to alleviate distortion and the like.

The heat-dissipating member is used in the form of a sheet, a film, a thin film, a fiber, a molded article, or the like. A preferable form is a form of a plate, a sheet, a film or a thin film. Here, in this specification, a film thickness of a sheet is 1 mm or more, a film thickness of a film is 5 μm or more, preferably 10 to 500 μm, and more preferably 20 to 300 μm, and a film thickness of a thin film is less than 5 μm. The film thickness may be appropriately changed according to applications. The composition for a heat-dissipating member can be directly used as an adhesive or a filler.

[Electronic Instrument]

An electronic instrument according to a third embodiment of the present invention includes the heat-dissipating member according to the second embodiment and an electronic device including a heating unit or a cooling unit. The heat-dissipating member may be disposed in the electronic device such that it comes in contact with the heating unit. The form of the heat-dissipating member may be any of a heat dissipation electronic substrate, a heat dissipation plate, a heat dissipation sheet, a heat dissipation film, a heat dissipation adhesive, and a heat dissipation molded article. In addition, the heat-dissipating member may be molded into a three-dimensional structure using a mold or the like, and used for a product in which thermal expansion of a precision instrument is a problem.

Examples of the electronic device include a semiconductor module. A heat-dissipating member has high thermal conductivity, high heat resistance, and strong insulation properties in addition to low thermal expansivity. Therefore, it is particularly effective for an insulated gate bipolar transistor (IGBT) which requires a more efficient heat dissipation mechanism for high power among semiconductor devices. An IGBT is one of semiconductor devices and is a bipolar transistor in which an MOSFET is incorporated in a gate part, and is used for a power control application. Examples of the electronic instrument including an IGBT include a main conversion element of a high power inverter, an uninterruptible power system, a variable voltage variable frequency control device of an AC motor, a control device of a railway vehicle, a hybrid vehicle, an electric transport device such as an electric vehicle, and an IH cooking device.

A case in which the second inorganic filler subjected to a coupling treatment and the first inorganic filler that is subjected to a coupling treatment and then additionally modified with a silsesquioxane are bonded to each other, a bond between the inorganic fillers is formed, a heat-dissipating member having low thermal expansivity, high thermal conductivity and heat resistance has been descried above as the present invention. However, the present invention is not limited thereto. Of course, the second inorganic filler that is subjected to a coupling treatment and then additionally modified with a silsesquioxane and the first inorganic filler subjected to a coupling treatment are bonded to each other, and thus a bond between the inorganic fillers may be formed.

Further, using only the inorganic filler that is subjected to a coupling treatment and then additionally modified with a silsesquioxane, silsesquioxanes are bonded to each other using an appropriate polymerization initiator or the like, and thus a bond between the inorganic fillers may be formed.

That is, according to the present invention, in combining an inorganic material and an organic compound, a bond is formed between inorganic materials according to the organic compound, thermal conductivity is significantly improved, and additionally, the heat resistance is further improved.

EXAMPLES

The present invention will be described below in detail with reference to examples. However, the present invention is not limited to details described in the following examples.

Materials constituting the heat-dissipating member will be described using examples of the present invention are as follows.

<Polymerizable Silsesquioxane Compound>

Silsesquioxane 1: compound represented by the following Formula (6-1) (commercially available from JNC)

The compound can be synthesized by a method described in Japanese Patent No. 5013127.

In Formula (6-1), Me represents a methyl group, and Ph represents a phenyl group.

[Chem. 22]

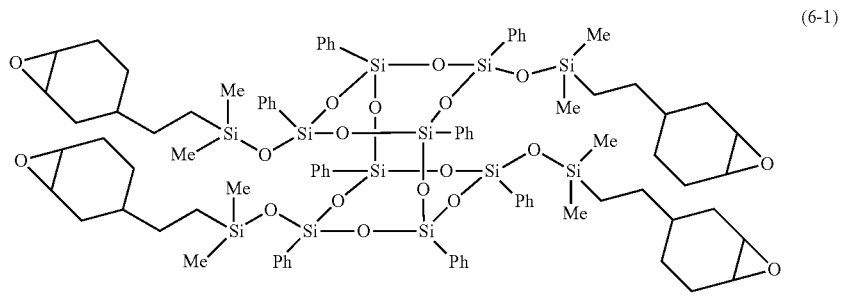

(6-1)

Silsesquioxane 2: compound represented by the following Formula (6-2) (commercially available from JNC)

The compound can be synthesized by a method described in Japanese Patent No. 5408597.

In Formula (6-2), Me represents a methyl group, and Ph represents a phenyl group.

[Chem. 23]

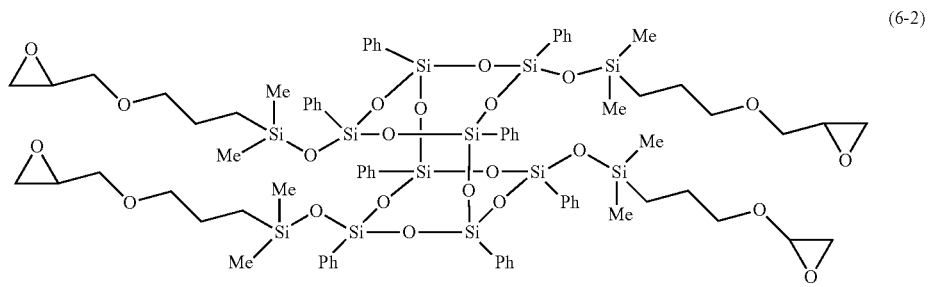

(6-2)

Silsesquioxane 3: compound represented by the following Formula (6-3) (commercially available from JNC)

The compound can be synthesized by a method described in Japanese Patent No. 5408597.

In Formula (6-3), Me represents a methyl group, and Ph represents a phenyl group.

[Chem. 24]

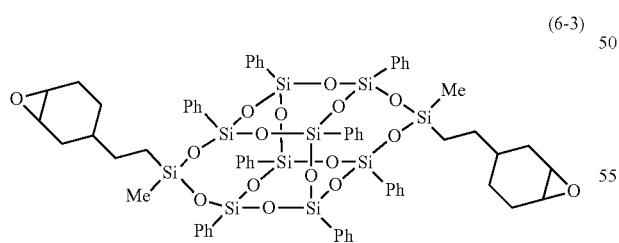

(6-3)

Silsesquioxane 4: compound represented by the following Formula (6-4) (commercially available from JNC)

The compound can be synthesized by a method described in Japanese Patent No. 4379120.

In Formula (6-4), Me represents a methyl group, and Ph represents a phenyl group.

[Chem. 25]

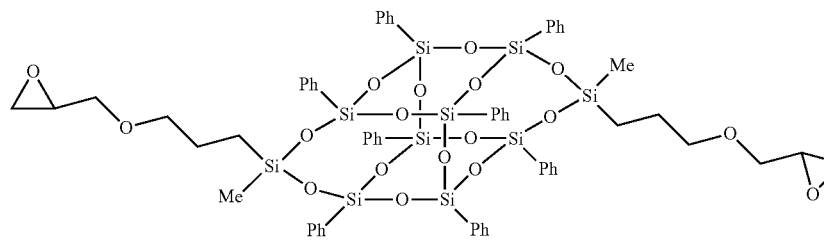

(6-4)

Silsesquioxane 5: compound represented by the following Formula (6-5) (commercially available from JNC)

The compound can be synthesized by a method described in Japanese Patent No. 4483344.

In Formula (6-5), Me represents a methyl group, and Ph represents a phenyl group.

[Chem. 26]

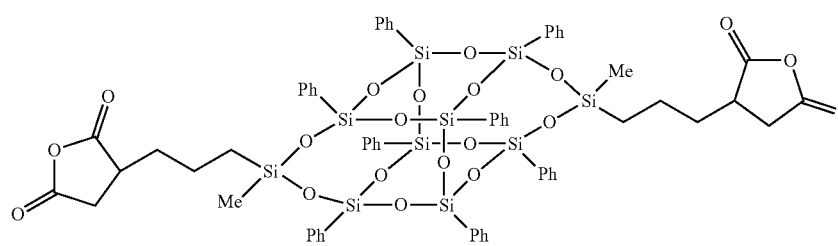

(6-5)

<Polymerizable Liquid Crystal Compound>

Liquid crystalline epoxy compound: compound represented by the following Formula (7-1) (commercially available from JNC)

The compound can be synthesized by a method described in Japanese Patent No. 5084148.

[Chem. 27]

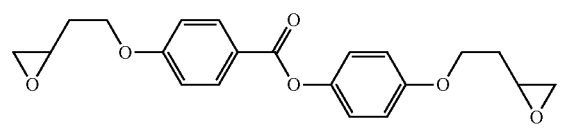

(7-1)

<Inorganic Fillers>

Boron nitride: h-BN particles ((product name) Polar-Therm PTX-25 commercially available from Momentive Performance Materials Japan)

<Silane Coupling Agent>

Silane coupling agent 1: N-(2-aminoethyl)-3-aminopropyltrimethoxysilane represented by the following Formula (8-1) ((product name) S320 commercially available from JNC)

[Chem. 28]

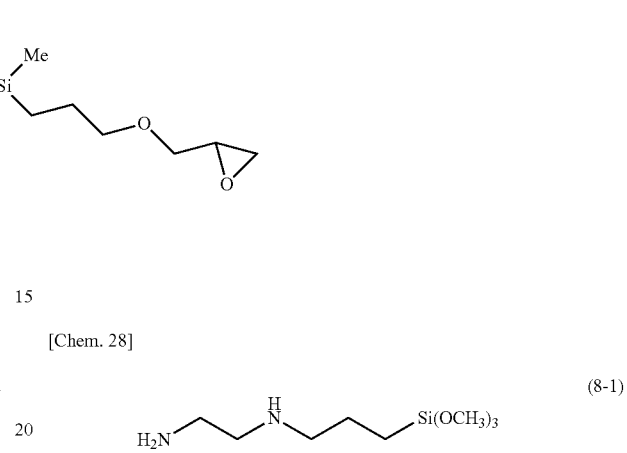

(8-1)

Silane coupling agent 2: 3-aminopropyltrimethoxysilane represented by the following Formula (8-2) ((product name) KBM-903 commercially available from Shin-Etsu Chemical Co., Ltd.)

[Chem. 29]

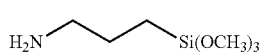

(8-2)

<Curing Agent>

Amine curing agent: 4,4'-diamino-1,2-diphenylethane (commercially available from JNC)

Example 1

<Preparation of Heat-Dissipating Member>

Preparation examples of the heat-dissipating member will be described below.

Preparation of Liquid Crystal Silane Coupling Agent Treated Boron Nitride Particles 5.0 g of boron nitride particles (PTX25, hereinafter abbreviated as BN) and 0.75 g of the silane coupling agent 1 were added to 50 mL of toluene (anhydrous), and the mixture was stirred at 750 rpm for 1 hour using a stirrer, and the obtained mixture was dried at 40° C. for 5 hours, and at room temperature for 19 hours. In addition, after the solvent was dried, a heat treatment was performed using a vacuum dryer set at 125° C. under vacuum conditions for 5 hours.

BN particles modified with the coupling agent were transferred into a sample tube, 50 mL of THF (commercially available from Nacalai Tesque Inc.) was added thereto, and pulverization was then performed using an ultrasonic treatment (MODEL450 commercially available from BRANSON). In addition, this solution was separated off and purified using a centrifuge (CT6E commercially available from Hitachi Koki Co., Ltd.) at 6,000 rpm for 10 minutes. After the supernatant solution was discarded, 50 mL of acetone was added thereto, and the same operation was performed twice. The modified BN particles after purification were dried in an oven at 60° C. for 24 hours. The obtained particles were used as the second inorganic filler (BN).

2.00 g and 3.00 g of the second inorganic filler and the silsesquioxane 1 (compound represented by Formula (6-1)) were weighed out (content of BN particles was 27 volume %), respectively, on pharmaceutical paper, and mixed using a mortar, and kneading was then performed using two rollers (HR-3 commercially available from Nitto reactor) at 120° C. for 10 minutes. Then, separation and purification were performed through an ultrasonic treatment and centrifugation, and BN particles modified with the silsesquioxane 1 from which unreacted components were removed were obtained. The particles were used as a first inorganic filler.

A coating amount of the first inorganic filler and the second inorganic filler with respect to BN particles of the silane coupling agent or the silsesquioxane 1 was calculated from a heating loss at 600° C. using thermogravimeter/differential thermal measurement device (EXSTAR TG/DTA5200 commercially available from Seiko Instruments Inc. (currently Hitachi High-Technologies Corporation)).

Mixing the First Inorganic Filler and the Second Inorganic Filler 0.0346 g of the produced second inorganic filler and 0.691 g of the first inorganic filler were weighed out, and were mixed using an agate mortar, and the mixture was then mixed using two rollers at 55° C. for 10 minutes.

<Molding and Curing>

The obtained mixture was inserted between stainless steel plates using a metal frame such that oxidization was not caused, pressing was performed to 9.8 MPa using a compression molding machine (F-37 commercially available from Shinto Metal Industry Co., Ltd.) set at 150° C., a heated state continued for 15 minutes, and thus an alignment treatment and precuring were performed. That is, when a mixture was spread between the stainless steel plates, since BN particles were plate-like particles, alignment was performed such that the particles and the stainless steel plates were parallel to each other. Amounts of a metal frame and the sample was adjusted such that the thickness of the sample was about 200 μm.

<Post-Curing>

The obtained precured sample was cured using a vacuum oven at 80° C. for 1 hour, and at 150° C. for 3 hours. A thermal expansion coefficient and thermal conductivity of the obtained sample were obtained.

Evaluation of Thermal Expansion Coefficient

A 5×20 mm test piece was cut out from the obtained sample, and a thermal expansion coefficient (measured by a TMA 7000 type thermomechanical analyzer commercially available from (currently) Hitachi High-Technologies Corporation) was obtained in a range of room temperature to 250° C. A temperature range was appropriately adjusted according to a heat resistance of the sample to be measured.

Evaluation of Thermal Conductivity and Thermal Diffusivity

Regarding the thermal conductivity, a specific heat (measured by a DSC type input compensation type differential scanning calorimeter EXSTAR 6000 commercially available from Seiko Instruments Inc. (currently Hitachi High-Technologies Corporation.)) and a specific gravity (measured by a specific gravity meter AG204 density measurement kit commercially available from METTLER TOLEDO) of the heat-dissipating member were obtained in advance, the value was multiplied by a thermal diffusivity obtained by a TC7000 thermal diffusivity measurement device (commercially available from Advance Riko, Inc), and thereby the thermal conductivity was obtained. Here, the thermal diffusivity in the thickness direction was measured when a sample was subjected to a blackening treatment using a carbon spray and a standard sample holder was used. In addition, an adapter with a distance of 5 mm between a location at which a laser beam was emitted and a location at which infrared rays were detected was produced, and the thermal diffusivity in the planar direction was calculated from a time until infrared rays were emitted from when a laser beam was emitted to the sample, and a distance thereof.

Example 2

A sample was produced in the same manner as in Example 1 except that the silsesquioxane 2 was used in place of the silsesquioxane 1, and measurement was performed.

Example 3

A sample was produced in the same manner as in Example 1 except that the silsesquioxane 3 was used in place of the silsesquioxane 1, and measurement was performed.

Example 4

A sample was produced in the same manner as in Example 1 except that the silsesquioxane 4 was used in place of the silsesquioxane 1, and measurement was performed.

Example 5

2.00 g and 3.00 g of a second inorganic filler produced in the same manner as in the second inorganic filler in Example 1 and the silsesquioxane 5 (compound represented by Formula (6-5)) were weighed out, respectively, on pharmaceutical paper, and mixed using a mortar, and kneading was then performed using two rollers at 160° C. for 10 minutes. Then, separation and purification were performed through an ultrasonic treatment and centrifugation, and BN particles modified with the silsesquioxane 5 from which unreacted components were removed were obtained. The particles were used as a first inorganic filler. As a result of preliminary experiments, succinic anhydride had a higher temperature required for a reaction than an epoxy group. Therefore, a sample was produced in the same manner as in Example 1 except that these fillers were used, a precuring time extended to 20 minutes, and a post-curing temperature was changed to 185° C., and measurement was performed.

Comparative Example 1

5.0 g of BN and 0.75 g of the silane coupling agent 2 (KBM903) were added to 50 mL of toluene (anhydrous), and the mixture was stirred at 750 rpm for 1 hour using a stirrer, and the obtained mixture was dried at 40° C. for 5 hours, and at room temperature for 19 hours. In addition, after the solvent was dried, a heat treatment was performed using a vacuum dryer set at 125° C. under vacuum conditions for 5 hours. In addition, BN particles were purified and dried in the same manner as in the second inorganic filler of Example 1.

Mixing with Diamine

The produced BN particles modified with the silane coupling agent 2, the liquid crystalline epoxy Compound (7-1), and the amine curing agent were weighed out on pharmaceutical paper such that a resin component (liquid crystalline epoxy component+diamine component) became 15 volume %, and mixed using a mortar, and kneading was then performed using two rollers (HR-3 commercially available from Nitto reactor) at 120° C. for 10 minutes. The mixture was inserted between the stainless steel plates in the same manner as in Example 1, and polymerization and molding were performed by heating and pressing.

Measurement results of the thermal expansion coefficient of Examples 1 to 5, and Comparative Example 1 are summarized in FIG. 4 to FIG. 10.

In a method in which a general high thermal conductive filler was dispersed in the epoxy resin and the curing agent, for example, as in Comparative Example 1, a thermal expansion coefficient greatly changed before and after a glass transition temperature. In Comparative Example 1, a liquid crystalline epoxy compound having excellent heat resistance and thermal expansivity was used. However, a composite material of a general bisphenol type epoxy compound and silica, the thermal expansion coefficient was about $50\times10^{-6}$/K and the heat resistant temperature was about 120° C. On the other hand, when the silsesquioxane having a polymerization group of the present invention is directly bonded to BN using a silane coupling agent, no clear glass transition point was observed and a change in the thermal expansion coefficient with respect to the temperature was very small. In addition, a feature that the thermal expansion coefficient itself was very small was obtained. In particular, in Example 1 and Example 3, the change was linear, and this is thought to be caused by the fact that the polymerization group was an alicyclic epoxy group, and fluctuation due to heat was small compared to the glycidyl ether of Examples 2 and 4. In addition, as in Example 3 and Example 4, in Example 5, regardless of a cage type silsesquioxane, the linearity of the graph was high compared to the measurement results of the thermal expansion coefficient. This is thought to be caused by the fact that an imide bond formed by a reaction of succinic anhydride and an amine had higher heat resistance than a bond between an epoxy group and an amine group. Therefore, it is found that, in applications for which heat resistance was particularly required, it was desirable to use an imide bond and other bonds having high heat resistance such as a maleimide bond.

Whether the organic-inorganic hybrid material of the present invention can be used even at 250° C. was checked using the thermogravimeter/differential thermal measurement device as in obtaining of a coating amount of the silane coupling agent. The TMA results are shown in FIG. 11.

Figure 11:
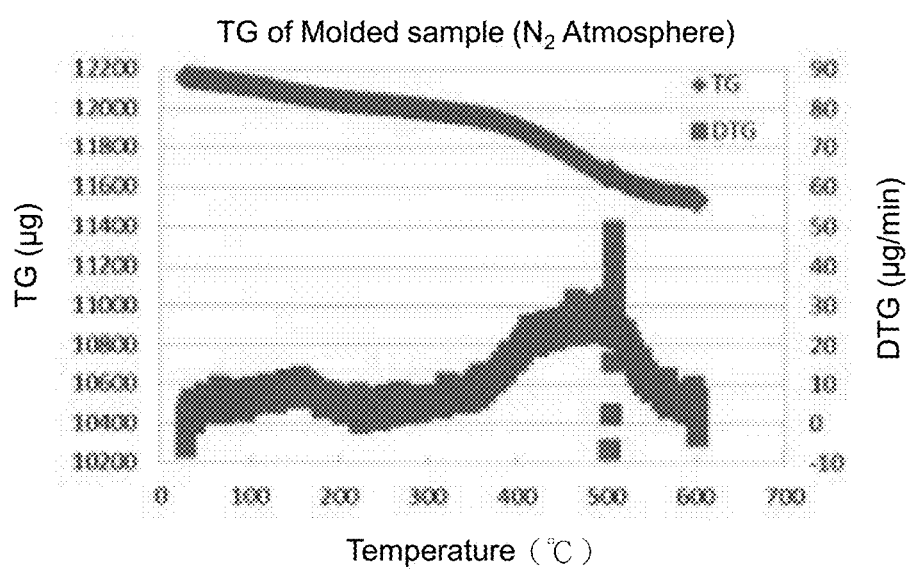
FIG. 11 is a graph showing TG/DTG in a nitrogen atmosphere.

In FIG. 11, it can be understood that a reduction in weight begun at 350° C. in the TG curve. A linear and slight inclination from room temperature was caused by a deviation of the base line. The organic-inorganic hybrid material of the present invention contained a very small amount of the organic component, and a reduction amount due to its decomposition was small, the inclination of the base line appeared significantly. On the other hand, in the DTA curve, a small peak was observed at about 150° C., but this was thought to be caused by a reaction of unreacted silsesquioxanes because there was almost no change in the weight and polymerization of an epoxy group occurred at about 150° C. and a melting point of the silsesquioxane was about 150° C. This is because conditions for producing a sample at this time were the same as conditions for a case in which a liquid crystalline epoxy compound was used, and when optimization such as curing at a higher temperature was performed, the peak was thought to disappear. On the other hand, a peak thought to be caused by decomposition of the composite material appeared at about 350° C. Therefore, it was found that the organic-inorganic hybrid material of the present invention was able to be used up to 350° C. under conditions in which no oxygen was in contact therewith and had very high heat resistance.

The measurement results of the thermal conductivity of Examples 1 to 5, and Comparative Example 1 are summarized in Table 1.

TABLE 1

Examples 1 to 5, Comparative Example 1

|  | Thermal conductivity in planar direction (W/mK) | Thermal conductivity in thickness direction (W/mK) |
| --- | --- | --- |
| Example 1 | 58.3 | 8.5 |
| Example 2 | 45.4 | 7.5 |
| Example 3 | 32.3 | 5.3 |
| Example 4 | 30.9 | 5.8 |
| Example 5 | 48.1 | 6.8 |
| Comparative Example 1 | 32.4 | 1.7 |

Based on Table 1, it can be understood that, comparing an alicyclic epoxy group and a glycidyl ether group, the alicyclic epoxy group had higher thermal conductivity, and comparing a double decker type silsesquioxane and a cage type silsesquioxane, the double decker type silsesquioxane had higher thermal conductivity. This is thought to be caused by the fact that, since the alicyclic group was more rigid than the ether group and was more likely to transfer phonon oscillation than the ether group, and it was necessary for the cage type silsesquioxane to vibrate the entire cage, and thus phonon conduction was less likely to be transferred compared to the double decker type silsesquioxane. In addition, as in Example 1, regarding whether all epoxy groups were bonded to an amine of the silane coupling agent, in consideration of steric hindrance, it is thought unlikely that all molecules were bonded at all four parts. In the double decker type, in the case in which bonding occurred only at two parts among functional groups, a phonon transfer path did not fully exhibit a feature of the double decker type and was similar to that of the ladder type silsesquioxane. Accordingly, when heat resistance is not important, the ladder type is thought to be preferably used. It can be understood that, except for a case of a cage type and glycidyl ether, the thermal conductivity was equal to or higher than that of a case in which a liquid crystalline epoxy compound was used, and the organic-inorganic hybrid material of the present invention is a material having high heat resistance and high thermal conductivity. On the other hand, in Example 5, despite the cage type silsesquioxane, high thermal conductivity comparable to that of the double decker type silsesquioxane was exhibited. This is thought to be caused by the fact that a binding site was rigid and phonon conduction was likely to be transferred.

All references including publications, patent applications, and patents cited in this specification are referred to and incorporated herein to the same extent as if the references were individually exemplified, referred to and incorporated, and all details thereof are described herein.

The use of nouns and corresponding demonstratives in the context of describing the present invention (especially in the context of the following claims) is to be construed to cover both the singular and the plural unless otherwise specified herein or otherwise clearly contradicted by context. The terms "comprise," "include," "contain," and "have" are interpreted as open-ended terms (that is, to mean "includes, but is not limited to") unless otherwise noted. Unless otherwise specified in this specification, the numerical ranges of objects in this specification are merely intended to serve as abbreviations for individually indicating values falling within the ranges, and the values are incorporated in this specification as if they were individually recited herein. All methods described herein can be performed in any appropriate order unless otherwise described herein or otherwise clearly contradicted by context. Unless otherwise claimed, any example or exemplary phrase (for example, "such as") used herein is intended merely to better describe the present invention and is not intended to limit the scope of the present invention. Terms in this specification should not be construed to indicate elements that are essential for the implementation of the present invention but are not described in the claims.

This specification includes the best means for implementing the present invention known to the inventors and preferable embodiments of the present invention have been described. Those skilled in the art will clearly understand modifications of such preferable embodiments that may be made upon reading the above description. The inventors expect such skilled people to appropriately apply such modifications and assume that the present invention will be implemented using methods other than those specifically described herein. Accordingly, the present invention includes all modifications and equivalents of content described in the claims appended to this specification as allowed by applicable law. Moreover, the present invention encompasses any combination of the above elements in all of the modifications unless otherwise described herein or clearly contradicted by the context.

The invention claimed is:

1. A composition for a heat-dissipating member comprising:
    a thermally conductive first inorganic filler that is bonded to one end of a first coupling agent;
    a thermally conductive second inorganic filler that is bonded to one end of a second coupling agent;
    an organic compound or a polymer compound that is not bonded to the first inorganic filler and the second inorganic filler; and
    wherein the composition further comprises
    a bifunctional or higher silsesquioxane that is capable of bonding to the other end of the first coupling agent and the other end of the second coupling agent through curing treatment, or
    at least one of the first coupling agent and the second coupling agent contains a silsesquioxane in its structure, and the other end of the first coupling agent and the other end of the second coupling agent are capable of bonding to each other through curing treatment.

2. The composition for a heat-dissipating member according to claim 1,
    wherein the first inorganic filler and the second inorganic filler are a nitride, a metal oxide, a silicate compound, or a carbon material.

3. The composition for a heat-dissipating member according to claim 1,
    wherein the first inorganic filler and the second inorganic filler are at least one selected from the group consisting of boron nitride, aluminum nitride, boron carbide, boron carbonitride, graphite, carbon fibers, carbon nanotubes, alumina, and cordierite.

4. The composition for a heat-dissipating member according to claim 1, further comprising
    a third inorganic filler having a different thermal expansion coefficient from those of the first inorganic filler and the second inorganic filler.

5. The composition for a heat-dissipating member according to claim 1,
    wherein the bifunctional or higher silsesquioxane is a silsesquioxane including oxiranyl, oxiranylene, succinic anhydride, phthalic anhydride, or 3,4-epoxycyclohexyl.

6. The composition for a heat-dissipating member according to claim 5,
    wherein the bifunctional or higher silsesquioxane is a compound selected from the groups of compounds represented by Formula (1) and Formula (2),

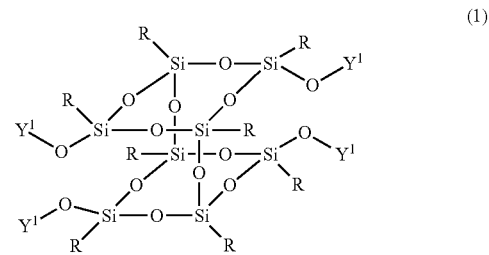

(1)

herein, R independently represent an alkyl group having 1 to 45 carbon atoms, a cycloalkyl group having 4 to 8 carbon atoms, an aryl group or an arylalkyl group; in the alkyl group having 1 to 45 carbon atoms, any hydrogen atom is optionally substituted with a fluorine atom and any —$CH_2$— is optionally substituted with —O— or —CH=CH—; in a benzene ring in the aryl group and the arylalkyl group, any hydrogen atom is optionally substituted with a halogen atom or an alkyl group having 1 to 10 carbon atoms; in the alkyl group having 1 to 10 carbon atoms, any hydrogen atom is optionally substituted with a fluorine atom and any —$CH_2$— is optionally substituted with —O— or —CH=CH—; in an alkylene group in the arylalkyl group, the number of carbon atoms is 1 to 10, and any —$CH_2$— is optionally substituted with —O—; and $Y^1$ independently represent a group represented by Formula (a);

(a)

herein, X independently represent a cyclopentyl group, a cyclohexyl group, an alkyl group having 1 to 10 carbon atoms in which any hydrogen atom is optionally substituted with a fluorine atom and one —CH₂— is optionally substituted with —O—, a phenyl group in which any hydrogen atom is optionally substituted with a halogen atom or an alkyl group having 1 to 10 carbon atoms, a phenylalkyl group including a phenyl group in which any hydrogen atom is optionally substituted with a halogen atom or an alkyl group having 1 to 10 carbon atoms and an alkylene group having 1 to 4 carbon atoms, or a group including oxiranyl, oxiranylene, succinic anhydride, phthalic anhydride, or 3,4-epoxycyclohexyl; in the alkyl group having 1 to 10 carbon atoms which is a substituent of the phenyl group, any hydrogen atom is optionally substituted with a fluorine atom and any —CH₂— is optionally substituted with —O—; in the alkylene group in the phenylalkyl group, one —CH₂— is optionally substituted with —O—; and at least one X is a group including oxiranyl, oxiranylene, succinic anhydride, phthalic anhydride, or 3,4-epoxycyclohexyl;

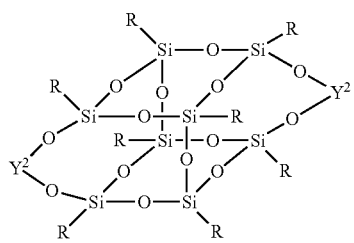

(2)

herein, R has the same meaning as R in Formula (1), and Y² is a group represented by Formula (b) or a group represented by Formula (c);

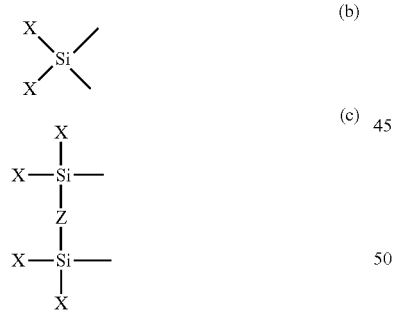

(b)

(c)

herein, in Formula (b) and Formula (c), X has the same meaning as X in Formula (a), and Z in Formula (c) is —O—, —CH₂— or a single bond.

7. The composition for a heat-dissipating member according to claim 6,
wherein, in Formula (1) and Formula (2), R independently represent a cyclohexyl group, a phenyl group in which any hydrogen atom is optionally substituted with a halogen atom or an alkyl group having 1 to 4 carbon atoms, or a phenylalkyl group including a phenyl group in which any hydrogen atom is optionally substituted with a halogen atom or an alkyl group having 1 to 4 carbon atoms and an alkylene group having 1 to 4 carbon atoms;

in the alkyl group having 1 to 4 carbon atoms which is a substituent of the phenyl group, any hydrogen atom is optionally substituted with a fluorine atom and one —CH₂— is optionally substituted with —O—;

X independently represent an alkyl group having 1 to 4 carbon atoms, a fluorinated alkyl group having 1 to 4 carbon atoms, a cyclopentyl group, a cyclohexyl group, a phenyl group in which any hydrogen atom is optionally substituted with a halogen atom or an alkyl group having 1 to 4 carbon atoms, a phenylalkyl group including a phenyl group in which any hydrogen atom is optionally substituted with a halogen atom or an alkyl group having 1 to 4 carbon atoms and an alkylene group having 1 to 4 carbon atoms, or a group including oxiranyl, oxiranylene, succinic anhydride, phthalic anhydride, or 3,4-epoxycyclohexyl, in the alkyl group having 1 to 4 carbon atoms which is a substituent of the phenyl group, any hydrogen atom is optionally substituted with a fluorine atom and any —CH₂— is optionally substituted with —O—; and in Formula (a), Formula (b) and Formula (c), at least one X is a group including oxiranyl, oxiranylene, succinic anhydride, phthalic anhydride, or 3,4-epoxycyclohexyl.

8. The composition for a heat-dissipating member according to claim 6,
wherein, in Formula (1) and Formula (2), R is a cyclohexyl group, a phenyl group in which any hydrogen atom is optionally substituted with a halogen atom or an alkyl group having 1 to 4 carbon atoms, or a phenylalkyl group including a phenyl group in which any hydrogen atom is optionally substituted with a halogen atom or an alkyl group having 1 to 4 carbon atoms and an alkylene group having 1 to 4 carbon atoms;

in the alkyl group having 1 to 4 carbon atoms which is a substituent of the phenyl group, any hydrogen atom is optionally substituted with a fluorine atom and one —CH₂— is optionally substituted with —O—;

in Formula (a), Formula (b) and Formula (c), one of X is a group including oxiranyl, oxiranylene, succinic anhydride, phthalic anhydride, or 3,4-epoxycyclohexyl, and the remaining X is an alkyl group having 1 to 4 carbon atoms, a fluorinated alkyl group having 1 to 4 carbon atoms, a cyclopentyl group, a cyclohexyl group, a phenyl group in which any hydrogen atom is optionally substituted with a halogen atom or an alkyl group having 1 to 4 carbon atoms, or a phenylalkyl group including a phenyl group in which any hydrogen atom is optionally substituted with a halogen atom or an alkyl group having 1 to 4 carbon atoms and an alkylene group having 1 to 4 carbon atoms, and in the alkyl group having 1 to 4 carbon atoms which is a substituent of the phenyl group, any hydrogen atom is optionally substituted with a fluorine atom and any —CH₂— is optionally substituted with —O—.

9. The composition for a heat-dissipating member according to claim 6,
wherein, in Formula (1) and Formula (2), R is a cyclohexyl or phenyl group; and
wherein, in Formula (a), Formula (b) and Formula (c), one of X is a group including oxiranyl, oxiranylene, succinic anhydride, phthalic anhydride, or 3,4-epoxycyclohexyl, and the remaining X is a methyl, ethyl, t-butyl, cyclopentyl, cyclohexyl or phenyl group.

10. The composition for a heat-dissipating member according to claim 6,
wherein, in Formula (1) and Formula (2), R is a phenyl group; and
wherein, in Formula (a), Formula (b) and Formula (c), one of X is a group including oxiranyl, oxiranylene, succinic anhydride, phthalic anhydride, or 3,4-epoxycyclohexyl, and the remaining X is a methyl or phenyl group.

11. The composition for a heat-dissipating member according to claim 5,
wherein the bifunctional or higher silsesquioxane is a compound represented by Formula (1-1), and
herein, in Formula (1-1), Me represents a methyl group, and Ph represents a phenyl group;

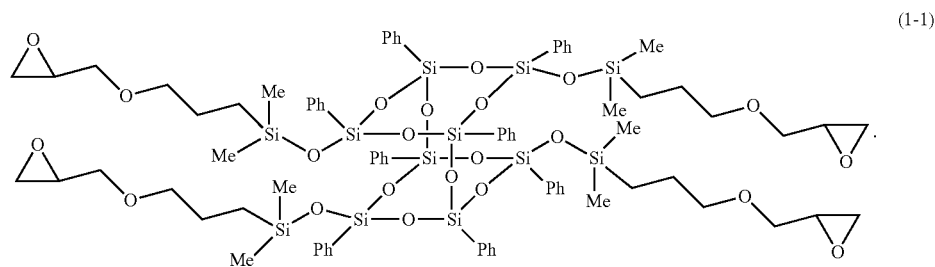 [SMILES: C[Si](C)(CCCOCC1CO1)O[Si]1(c2ccccc2)O[Si]2(c3ccccc3)O[Si](O[Si](C)(C)CCCOCC3CO3)(c3ccccc3)O[Si](c3ccccc3)(O1)O[Si]1(c3ccccc3)O[Si](O[Si](C)(C)CCCOCC3CO3)(c3ccccc3)O[Si](c3ccccc3)(O[Si](O[Si](C)(C)CCCOCC3CO3)(c3ccccc3)O1)O2]

(1-1)

12. The composition for a heat-dissipating member according to claim 5,
wherein the bifunctional or higher silsesquioxane is a compound represented by Formula (1-2), and
herein, in Formula (1-2), Me represents a methyl group, and Ph represents a phenyl group;

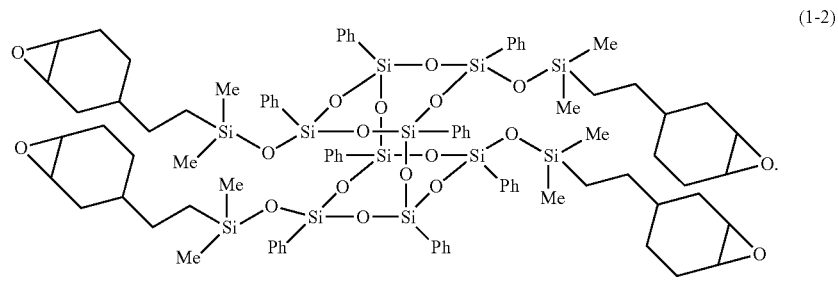 [SMILES: C[Si](C)(CCC1CCC2OC2C1)O[Si]1(c2ccccc2)O[Si]2(c3ccccc3)O[Si](O[Si](C)(C)CCC3CCC4OC4C3)(c3ccccc3)O[Si](c3ccccc3)(O1)O[Si]1(c3ccccc3)O[Si](O[Si](C)(C)CCC3CCC4OC4C3)(c3ccccc3)O[Si](c3ccccc3)(O[Si](O[Si](C)(C)CCC3CCC4OC4C3)(c3ccccc3)O1)O2]

(1-2)

13. The composition for a heat-dissipating member according to claim 5,
wherein the bifunctional or higher silsesquioxane is a compound represented by Formula (2-1), and
herein, in Formula (2-1), Me represents a methyl group, and Ph represents a phenyl group;

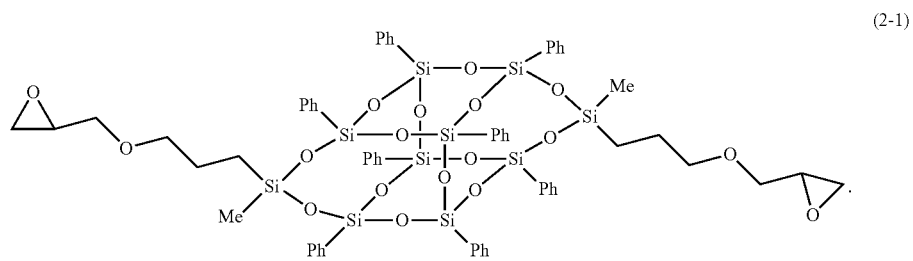 [SMILES: C[Si]1(CCCOCC2CO2)O[Si]2(c3ccccc3)O[Si]3(c4ccccc4)O[Si]4(c5ccccc5)O[Si](C)(CCCOCC5CO5)O[Si]5(c6ccccc6)O[Si](c6ccccc6)(O[Si](c6ccccc6)(O1)O[Si](c1ccccc1)(O5)O[Si](c1ccccc1)(O2)O4)O3]

(2-1)

14. The composition for a heat-dissipating member according to claim 5,
   wherein the bifunctional or higher silsesquioxane is a compound represented by Formula (2-2), and
   herein, in Formula (2-2), Me represents a methyl group, and Ph represents a phenyl group;

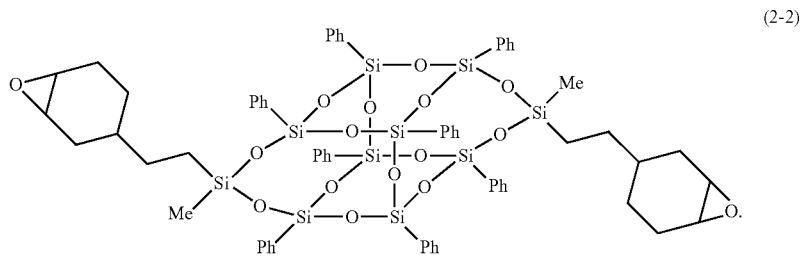 [SMILES: C[Si]1(CCC2CCC3OC3C2)O[Si]2(c3ccccc3)O[Si]3(c4ccccc4)O[Si]4(c5ccccc5)O[Si](C)(CCC5CCC6OC6C5)O[Si]5(c6ccccc6)O[Si](c6ccccc6)(O[Si](c6ccccc6)(O1)O[Si](c1ccccc1)(O5)O[Si](c1ccccc1)(O2)O4)O3]

(2-2)

15. The composition for a heat-dissipating member according to claim 5,
   wherein the bifunctional or higher silsesquioxane is a compound represented by Formula (3-1), and
   herein, in Formula (3-1), Me represents a methyl group, and Ph represents a phenyl group;

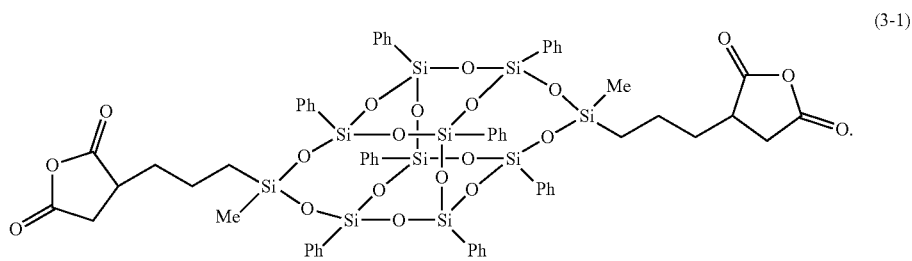 [SMILES: C[Si]1(CCCC2CC(=O)OC2=O)O[Si]2(c3ccccc3)O[Si]3(c4ccccc4)O[Si]4(c5ccccc5)O[Si](C)(CCCC5CC(=O)OC5=O)O[Si]5(c6ccccc6)O[Si](c6ccccc6)(O[Si](c6ccccc6)(O1)O[Si](c1ccccc1)(O5)O[Si](c1ccccc1)(O2)O4)O3]

(3-1)

16. A heat-dissipating member obtained by curing the composition for a heat-dissipating member according to claim 1.

17. An electronic instrument comprising:
   the heat-dissipating member according to claim 16; and
   an electronic device including a heating unit,
   wherein the heat-dissipating member is disposed on the electronic device such that it comes in contact with the heating unit.

18. A method for producing a heat-dissipating member comprising:
   preparing a composition by:
      a process of bonding a thermally conductive first inorganic filler to one end of a first coupling agent;
      a process of bonding a thermally conductive second inorganic filler to one end of a second coupling agent, and
      mixing an organic compound or a polymer compound into the composition, the method further includes using the composition to produce the heat-dissipating member by:

a process of bonding the other end of the first coupling agent and the other end of the second coupling agent to a bifunctional or higher silsesquioxane; or a process of incorporating a silsesquioxane in a structure of at least one of the first coupling agent and the second coupling agent and bonding the other end of the first coupling agent and the other end of the second coupling agent;

and wherein the organic compound or the polymer compound is not bonded to the first inorganic filler and the second inorganic filler after curing the composition to produce the heat-dissipating member.

19. The composition for a heat-dissipating member according to claim 2, wherein the first inorganic filler and the second inorganic filler are at least one selected from the group consisting of boron nitride, aluminum nitride, boron carbide, boron carbonitride, graphite, carbon fibers, carbon nanotubes, alumina, and cordierite.

* * * * *